(12) United States Patent
Takabayashi et al.

(10) Patent No.: US 9,793,684 B2
(45) Date of Patent: Oct. 17, 2017

(54) LASER APPARATUS

(71) Applicant: FUJITSU LIMITED, Kawasaki-shi, Kanagawa (JP)

(72) Inventors: Kazumasa Takabayashi, Atsugi (JP); Tsuyoshi Yamamoto, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/379,735

(22) Filed: Dec. 15, 2016

(65) Prior Publication Data
US 2017/0098921 A1    Apr. 6, 2017

Related U.S. Application Data

(63) Continuation of application No. PCT/JP2014/066194, filed on Jun. 18, 2014.

(51) Int. Cl.
*H01S 5/14* (2006.01)
*H01S 5/10* (2006.01)
(Continued)

(52) U.S. Cl.
CPC .......... *H01S 5/142* (2013.01); *H01S 5/02284* (2013.01); *H01S 5/0425* (2013.01);
(Continued)

(58) Field of Classification Search
CPC ...... H01S 5/142; H01S 5/0425; H01S 5/3235; H01S 5/02284; H01S 5/4012; H01S 5/1071; H04J 14/02
See application file for complete search history.

(56) References Cited

U.S. PATENT DOCUMENTS

| | | | |
|---|---|---|---|
| 6,665,320 B1 * | 12/2003 | Arbore | H01S 5/4062 372/20 |
| 2004/0022280 A1 * | 2/2004 | Lai | H01S 3/0057 372/5 |

(Continued)

FOREIGN PATENT DOCUMENTS

| | | |
|---|---|---|
| JP | 2006-245344 A1 | 9/2006 |
| JP | 2009-130351 A1 | 6/2009 |

(Continued)

OTHER PUBLICATIONS

International Search Report for International Application No. PCT/JP2014/066194 dated Jan. 13, 2015.

*Primary Examiner* — Dung Nguyen
(74) *Attorney, Agent, or Firm* — Kratz, Quintos & Hanson, LLP

(57) ABSTRACT

A laser apparatus includes first and second gain media; first, second, and third wavelength selection filters; and first and second mirrors. The wavelengths of first and second laser light emitted from end surfaces of the first and second gain media, respectively, are different from each other. The third wavelength selection filter is a wavelength selection filter to select light having wavelengths that cyclically exist in the light, as light to be selected. The other end surfaces of the first and second gain media are connected with the first input/output ports of the first and second wavelength selection filters, respectively. The fourth input/output ports of the first and second gain media are connected with the first and second mirrors, respectively. The first and second input/output ports of the third wavelength selection filter are connected with the second input/output ports of the first and second wavelength selection filters, respectively.

15 Claims, 18 Drawing Sheets

(51) Int. Cl.
*H01S 5/40* (2006.01)
*H01S 5/022* (2006.01)
*H01S 5/32* (2006.01)
*H01S 5/323* (2006.01)
*H01S 5/042* (2006.01)
*H04J 14/02* (2006.01)

(52) U.S. Cl.
CPC .......... *H01S 5/1071* (2013.01); *H01S 5/3211* (2013.01); *H01S 5/3235* (2013.01); *H01S 5/4012* (2013.01); *H04J 14/02* (2013.01)

(56) References Cited

U.S. PATENT DOCUMENTS

| | | |
|---|---|---|
| 2006/0198416 A1 | 9/2006 | Yamazaki |
| 2009/0135857 A1 | 5/2009 | Oh |
| 2010/0034224 A1 | 2/2010 | Takabayashi |
| 2010/0284649 A1 | 11/2010 | Ishii |
| 2011/0235659 A1 | 9/2011 | Fukuda |

FOREIGN PATENT DOCUMENTS

| | | |
|---|---|---|
| JP | 2010-040927 A1 | 2/2010 |
| JP | 2010-087472 A1 | 4/2010 |
| JP | 2010-212472 A1 | 9/2010 |
| JP | 2011-204895 A1 | 10/2011 |
| WO | 2009/096431 A1 | 8/2009 |

\* cited by examiner

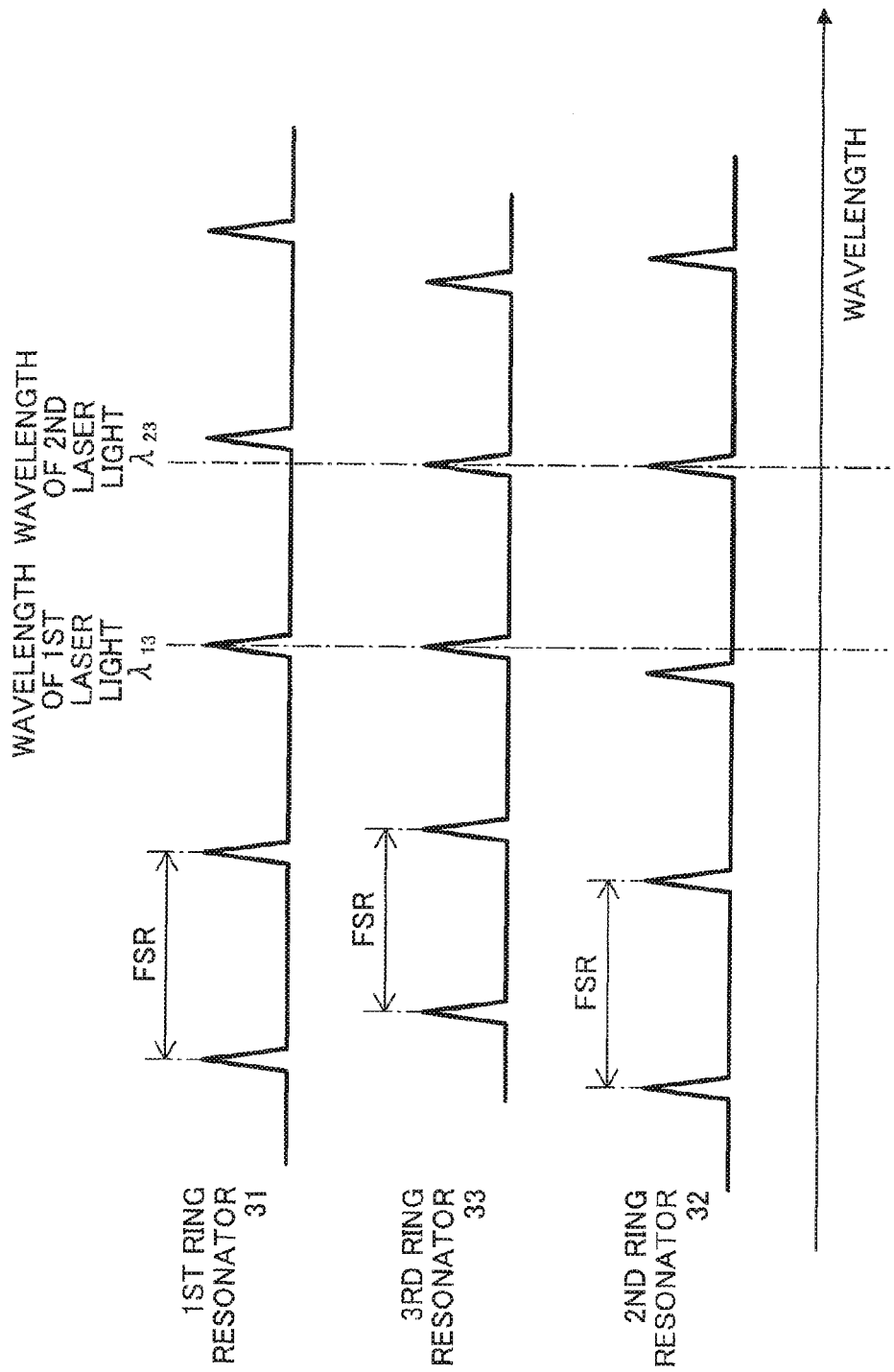

FIG.14A
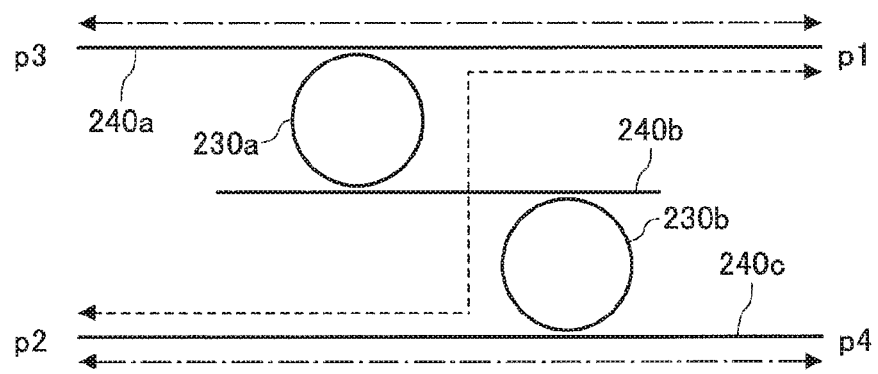
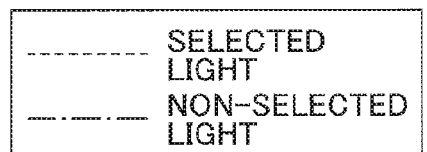
FIG.14B
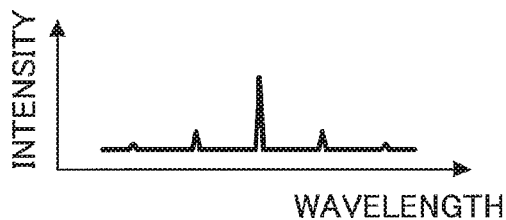
FIG.14C
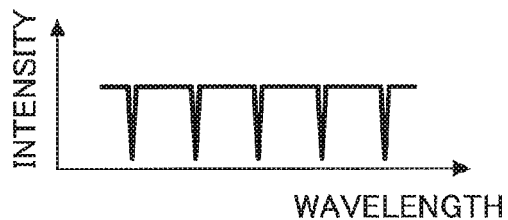

LASER APPARATUS

CROSS-REFERENCE TO RELATED APPLICATIONS

This application is a continuation application of International Application PCT/JP2014/066194 filed on Jun. 18, 2014 and designated the U.S., the entire contents of which are incorporated herein by reference.

FIELD

The present disclosure relates to a laser apparatus.

BACKGROUND

In an optical communication system for trunk lines, large-capacity optical transmission is executed by using a wavelength multiplexing communication system in which multiple optical signals having different wavelengths are transmitted through a single fiber. In such a wavelength multiplexing communication system, variable wavelength lasers have become indispensable devices because the oscillation wavelength can be changed in a wide wavelength range. In wavelength multiplexing communication, predetermined wavelength channels (ITU-T grids) are set in advance, and the wavelengths are controlled in variable wavelength lasers to be adjusted to the corresponding grids, respectively.

The transmission capacity of a wavelength multiplexing communication system is represented by a product of the bit rate per wavelength channel multiplied by the number of wavelength channels to be used, and hence, the greater the number of wavelength channels becomes, the more the transmission capacity increases. The number of wavelength channels is determined by a range of wavelengths to be used (for example, a range of wavelengths from 1525 nm to 1565 nm, called "C-band"), and the wavelength interval of the wavelength channels. Therefore, given a certain wavelength range, if the wavelength interval can be set narrower, the number of wavelength channels can be greater, and hence, the transmission capacity becomes greater.

In a current wavelength multiplexing communication system, the modulation baud rates of wavelengths are 10 Gbaud and 25 Gbaud, and the wavelength interval is set to 50 GHz (about 0.4 nm) as illustrated in FIG. 1A. In contrast to this, for the next-generation wavelength multiplexing communication system, increasing the transmission capacity has been under investigation that uses a Nyquist method or an optical orthogonal frequency division multiplexing (optical OFDM) method, so that the wavelength interval is narrowed down to a modulation baud rate being the physical limit. Specifically, as illustrated in FIG. 1B, it has been investigated to narrow the wavelength interval down to a modulation baud rate being the physical limit, for example, the wavelength interval 25 GHz for 25 Gbaud, for increasing the transmission capacity.

RELATED-ART DOCUMENTS

Patent Documents

[Patent Document 1] Japanese Laid-open Patent Publication No. 2006-245344

In a conventional wavelength multiplexing communication system, the laser light source of each wavelength channel has a wavelength locker installed to individually control the wavelength of the laser light emitted from the laser light source, and the wavelengths are controlled independently from each other. The wavelength locker is a device that monitors light output from the light source so as to control the light to have a desired wavelength, by having a part of the light pass through a Fabry-Perot etalon by which the intensity of transmitting light changes cyclically with respect to the wavelength, to monitor the light. Precision of such a wavelength locker may have an error up to about several GHz, depending on the error of values monitored by photodiodes, and the error of the feedback control.

In this regard, a specific case illustrated in FIG. 2 will be described in which a first laser light source 910 and a second laser light source 920 are provided to emit laser light having different wavelengths, respectively. The first laser light source 910 includes a first variable wavelength laser 911 and a first wavelength locker 912, and a part of first laser light emitted from the first variable wavelength laser 911 is reflected by a partially-reflecting mirror 913, and then, incident on the first wavelength locker 912. The first wavelength locker 912 includes a partially-reflecting mirror 914 to split off the first laser light incident on the first wavelength locker 912. Among the first laser light incident on the first wavelength locker 912, laser light having passed through the partially-reflecting mirror 914 is incident on a photodetector 915, and laser light having reflected on the partially-reflecting mirror 914 is incident on a photodetector 917 via an etalon 916. Therefore, the photodetector 917 only detects the laser light having passed through the etalon 916. The ratio of the amounts of the light detected by the photodetector 917 and the photodetector 915, respectively, takes a value corresponding to the transmittance of the etalon 916, and the value changes depending on the wavelength. Therefore, based on this ratio, feedback can be applied so that the wavelength of the first laser light emitted from the first variable wavelength laser 911 becomes to have a desired wavelength. Note that the first laser light having passed through the partially-reflecting mirror 913 is used as signal light in optical communication.

Also, the second laser light source 920 includes a second variable wavelength laser 921 and a second wavelength locker 922, and a part of second laser light emitted from the second variable wavelength laser 921 is reflected by a partially-reflecting mirror 923, and then, incident on the second wavelength locker 922. The second wavelength locker 922 includes a partially-reflecting mirror 924 to split off the second laser light incident on the second wavelength locker 922. Among the second laser light incident on the second wavelength locker 922, laser light having passed through the partially-reflecting mirror 924 is incident on a photodetector 925, and laser light having reflected on the partially-reflecting mirror 924 is incident on a photodetector 927 via an etalon 926. Therefore, the photodetector 927 only detects the laser light having passed through the etalon 926. The ratio of the amounts of the light detected by the photodetector 927 and the photodetector 925, respectively, takes a value corresponding to the transmittance of the etalon 926, and the value changes depending on the wavelength. Therefore, feedback can be applied so that the wavelength of the second laser light emitted from the second variable wavelength laser 921 becomes to have a desired wavelength. Note that the second laser light having passed through the partially-reflecting mirror 923 is used as signal light in optical communication.

Thus, the first laser light source 910 and the second laser light source 920 are controlled independently. Therefore, if the wavelength of the first laser light and the wavelength of the second laser light are close to each other as illustrated in FIG. 3, the wavelength range of the first laser light may overlap with the wavelength range of the second laser light range.

If the wavelength interval between adjacent wavelength channels is less than or equal to the modulation baud rate as such, respective optical signals are mixed with each other, and normal transmission cannot be executed. Therefore, considering the wavelength error, it is necessary to secure the wavelength interval to be greater than or equal to the minimum modulation baud rate. Consequently, the wavelength interval needs to have a margin of the wavelength error, namely, about several GHz, and hence, a limit has been imposed to narrow down the wavelength interval. As a result, the transmission capacity of a wavelength multiplexing communication system cannot have been increased sufficiently.

SUMMARY

According to an embodiment, a laser apparatus includes a first gain medium; a partially-reflecting mirror placed on a side of one end surface of the first gain medium; a second gain medium; a partially-reflecting mirror placed on a side of one end surface of the second gain medium; a first wavelength selection filter; a second wavelength selection filter; a third wavelength selection filter; a first mirror; and a second mirror. A wavelength of first laser light emitted from the one end surface of the first gain medium is different from a wavelength of second laser light emitted from the one end surface of the second gain medium. Each of the first wavelength selection filter, the second wavelength selection filter, and the third wavelength selection filter includes a first input/output port, a second input/output port, a third input/output port, and a fourth input/output port. For light to be selected having a selected wavelength, the first input/output port is connected with the second input/output port, and the third input/output port is connected with the fourth input/output port; for light not to be selected, the first input/output port is connected with the third input/output port, and the second input/output port is connected with the fourth input/output port. The third wavelength selection filter is a wavelength selection filter to select light having wavelengths that cyclically exist in the light, as the light to be selected. Another end surface of the first gain medium is connected with the first input/output port of the first wavelength selection filter. Another end surface of the second gain medium is connected with the first input/output port of the second wavelength selection filter. The fourth input/output port of the first wavelength selection filter is connected with the first mirror. The fourth input/output port of the second wavelength selection filter is connected with the second mirror. The first input/output port of the third wavelength selection filter is connected with the second input/output port of the first wavelength selection filter. The second input/output port of the third wavelength selection filter is connected with the second input/output port of the second wavelength selection filter.

The object and advantages of the present embodiments will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIG. 7 is a diagram illustrating (1) of a laser apparatus in the first embodiment;

FIGS. 14A-14C are diagrams illustrating a wavelength selection filter in the third embodiment;

DESCRIPTION OF EMBODIMENTS

In the following, embodiments will be described with reference to the drawings. Note that the same reference symbols are assigned to the same members, and their description may be omitted. According to an embodiment, a laser apparatus can narrow the wavelength interval for laser light that has different wavelengths to be emitted, and hence, the transmission capacity of a wavelength multiplexing communication system cannot have been increased sufficiently.

First Embodiment

Figure 1A:
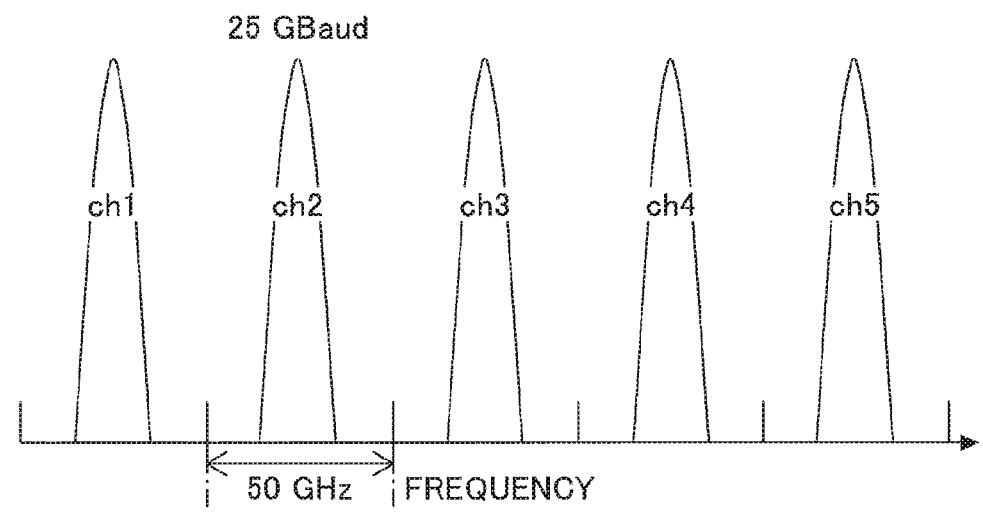
FIGS. 1A-1B are diagrams illustrating a wavelength multiplexing communication system.
Figure 1B:
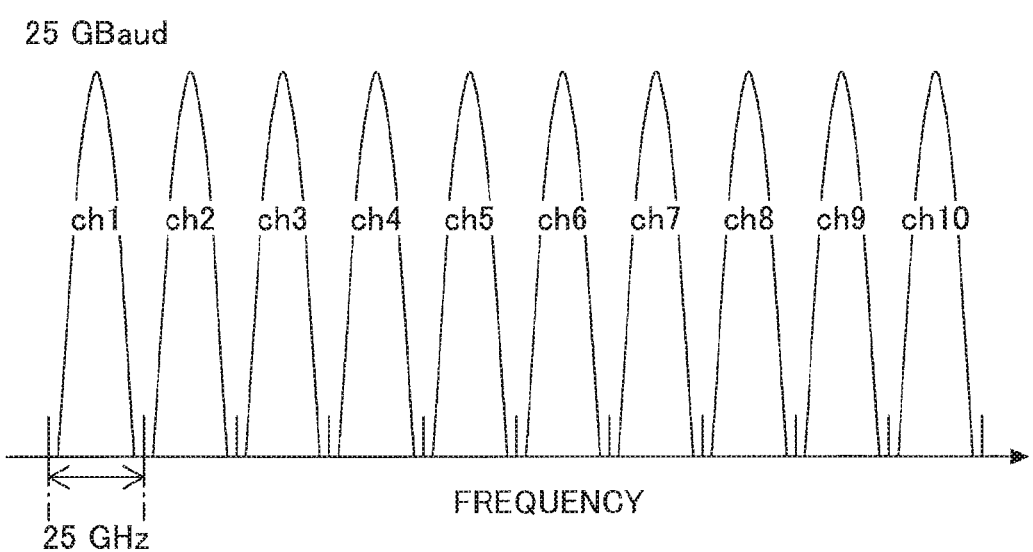
Figure 2:
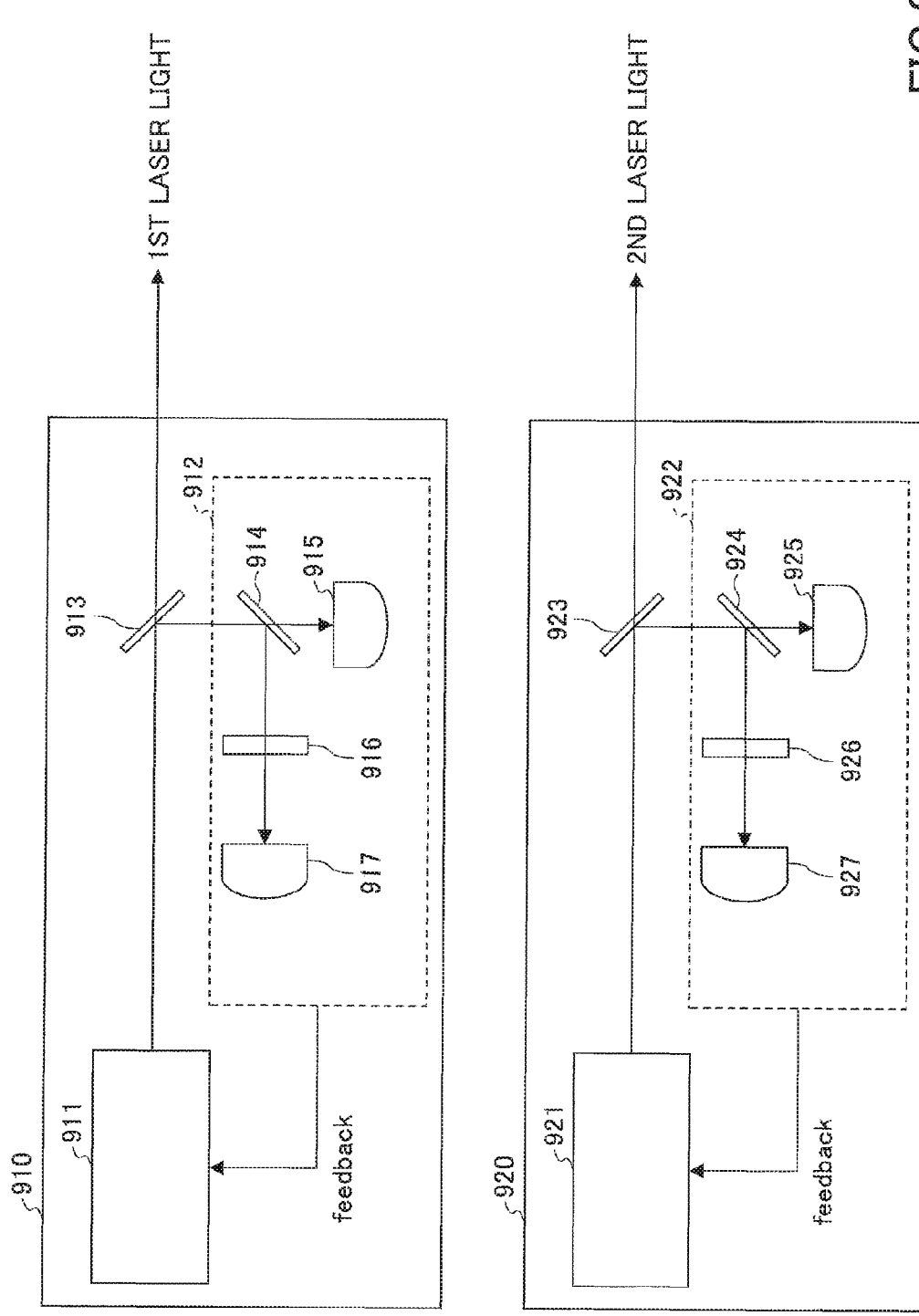
FIG. 2 is a structural diagram of a conventional laser apparatus.
Figure 3:
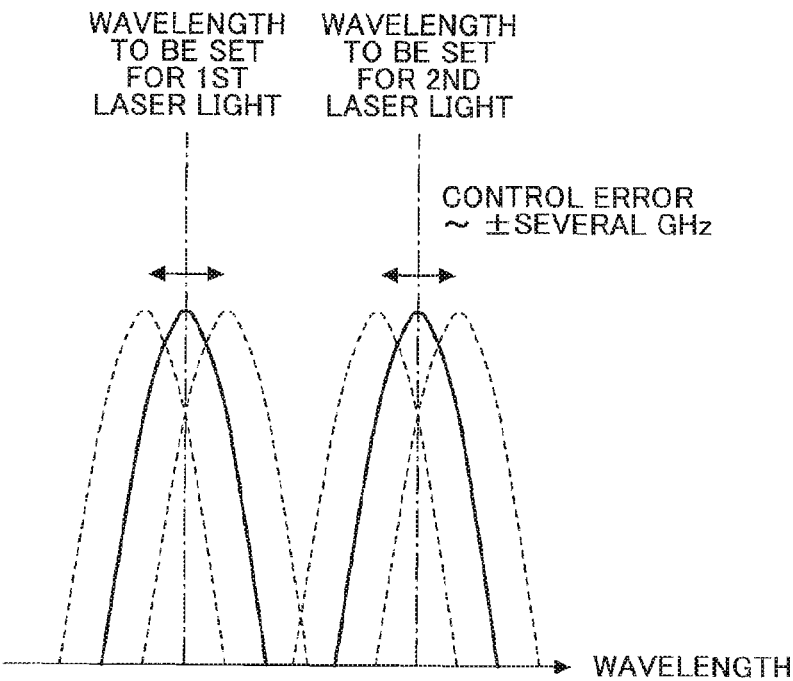
FIG. 3 is a diagram illustrating a conventional laser apparatus.
Figure 4:
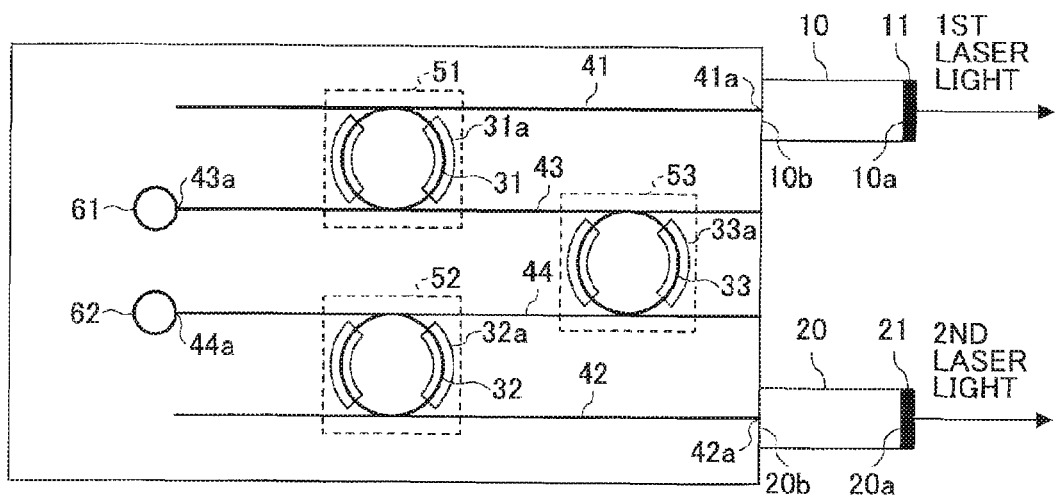
FIG. 4 is a structural diagram (1) of a laser apparatus in a first embodiment.

A laser apparatus in a first embodiment will be described. As illustrated in FIG. 4, the laser apparatus in the present embodiment includes a first SOA (Semiconductor Optical Amplifier) 10, a second SOA 20, a first ring resonator 31, a second ring resonator 32, and a third ring resonator 33. Note that in the present application, the first SOA 10 may be referred to as a first gain medium, and the second SOA 20 may be referred to as a second gain medium.

In the laser apparatus in the present embodiment, first laser light is emitted from one end surface 10a of the first SOA 10, and second laser light is emitted from one end surface 20a of the second SOA 20. Therefore, the one end surface 10a of the first SOA 10 has a partially-reflecting mirror 11 formed by a cleavage surface or a partially-reflecting film, and the one end surface 20a of the second SOA 20 has a partially-reflecting mirror 21 formed by a cleavage surface or a partially-reflecting film.

The first ring resonator 31, the second ring resonator 32, and the third ring resonator 33 are formed by silicon waveguides formed on a silicon substrate. A first optical waveguide 41, a second optical waveguide 42, a third optical waveguide 43, and a fourth optical waveguide 44 are also formed by silicon waveguides on this silicon substrate. Note that the ring part of the first ring resonator 31 has a heater electrode 31a formed, the ring part of the second ring resonator 32 has a heater electrode 32a formed, and the ring part of the third ring resonator 33 has a heater electrode 33a formed. By flowing currents in these heater electrodes to be heated, the resonance wavelengths in the ring resonators can be finely adjusted, respectively.

The first SOA 10 is disposed so that the light is emitted from, and incident on, between another end surface 10b of the first SOA 10, and one terminal part 41a of the first optical waveguide 41. The first ring resonator 31 is formed between the first optical waveguide 41 and the third optical waveguide 43, the first ring resonator 31 and the first optical waveguide 41 are placed close to each other, and the first ring resonator 31 and the third optical waveguide 43 are placed close to each other. Note that it is preferable that the one terminal part 41a of the first optical waveguide 41 has a spot-size converter formed (not illustrated) so as to raise the optical coupling efficiency with the first SOA 10.

The second SOA 20 is disposed so that the light is emitted from, and incident on, between another end surface 20b of the second SOA 20, and the one terminal part 42a of the second optical waveguide 42. The second ring resonator 32 is formed between the second optical waveguide 42 and the fourth optical waveguide 44, the second ring resonator 32 and the second optical waveguide 42 are placed close to each other, and the second ring resonator 32 and the fourth optical waveguide 44 are placed close to each other. Note that it is preferable that the one terminal part 42a of the second optical waveguide 42 has a spot-size converter formed (not illustrated) so as to raise the optical coupling efficiency with the second SOA 20.

The third ring resonator 33 is formed between the third optical waveguide 43 and the fourth optical waveguide 44, the third ring resonator 33 and the third optical waveguide 43 are placed close to each other, and the third ring resonator 33 and the fourth optical waveguide 44 are placed close to each other. Also, one terminal part 43a of the third optical waveguide 43 has a first loop mirror 61 formed, and one terminal part 44a of the fourth optical waveguide 44 has a second loop mirror 62 formed. Note that the first loop mirror 61 and the second loop mirror 62 are also formed by silicon waveguides formed on the silicon substrate.

In the laser apparatus in the present embodiment, a first wavelength selection filter 51 is formed with the first ring resonator 31, and the first optical waveguide 41 and the third optical waveguide 43 close to the first ring resonator 31. Also, a second wavelength selection filter 52 is formed with the second ring resonator 32, and the second optical waveguide 42 and the fourth optical waveguide 44 close to the second ring resonator 32. Also, a third wavelength selection filter 53 is formed with the third ring resonator 33, and the third optical waveguide 43 and the fourth optical waveguide 44 close to the third ring resonator 33.

Figure 5A:
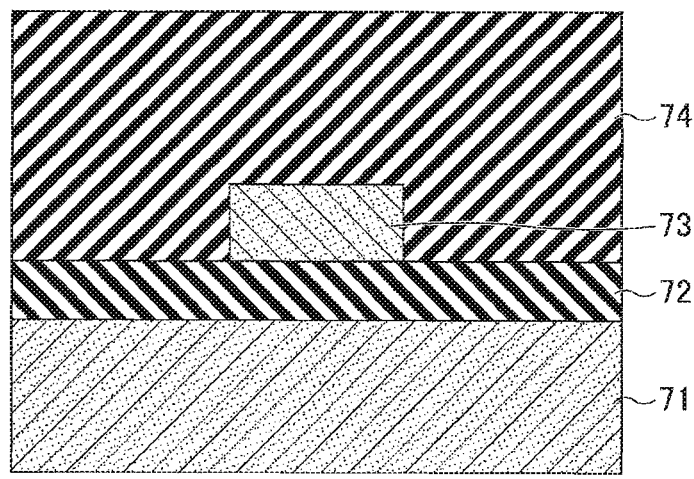
FIGS. 5A-5B are structural diagrams (2) of a laser apparatus in the first embodiment.

As described above, the first ring resonator 31, the second ring resonator 32, the third ring resonator 33, the first optical waveguide 41, the second optical waveguide 42, the third optical waveguide 43, and the fourth optical waveguide 44 are formed by the silicon waveguides. As illustrated in FIG. 5A, a silicon waveguide is formed of a lower cladding layer 72 formed over a silicon substrate 71, a core layer 73 formed over the lower part cladding layer 72, and an upper cladding layer 74 formed to cover the core layer 73. The lower cladding layer 72 is formed of $SiO_2$, the upper cladding layer 74 is formed of $SiO_2$, SiN, SiON, etc., the core layer 73 is formed of Si to have the width of 0.5 μm and the height of 0.2 μm, and the light propagates through the core layer 73 as the center. In the present embodiment, this silicon waveguide is formed by processing an SOI (Silicon on Insulator) substrate.

Figure 5B:
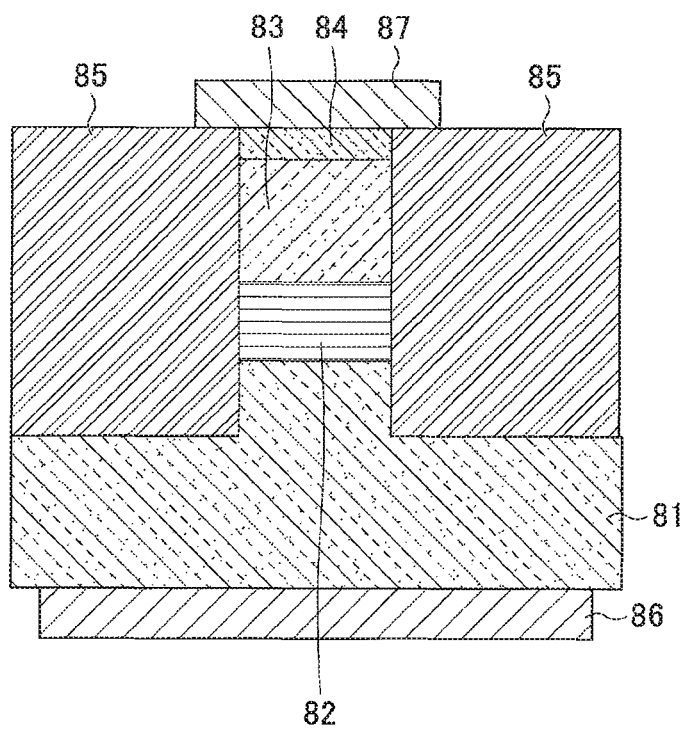

As illustrated in FIG. 5B, the first SOA 10 and the second SOA 20 include a lower cladding layer 81 formed of n-InP, an active layer 82 formed over the lower cladding layer 81, an upper cladding layer 83 formed of p-InP over the active layer 82, and a p-contact layer 84 formed of p-InGaAsP/InGaAs, which are stacked in this order. A part of the p-contact layer 84, the upper cladding layer 83, the active layer 82, and the lower cladding layer 81 are removed in a stripe shape, and in the removed regions, an embedded layer 85 is formed of semi-insulative InP. Note that an n-electrode 86 is formed on the reverse side of the lower cladding layer 81, and a p-electrode 87 is formed on the p-contact layer 84.

(Wavelength Selection Filter)

Figure 6A:
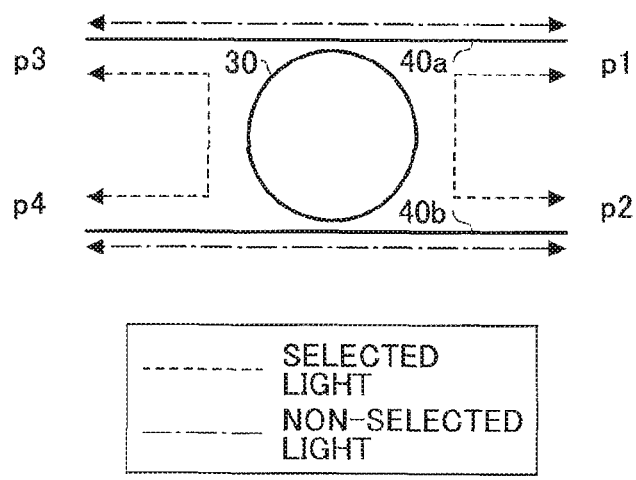
FIGS. 6A-6C are diagrams illustrating a wavelength selection filter in the first embodiment.

Next, a wavelength selection filter using a ring resonator, which is used for the laser apparatus in the present embodiment, will be described based on FIGS. 6A-6C. As illustrated in FIG. 6A, this wavelength selection filter includes a ring resonator 30, and two optical waveguides 40a and 40b placed close to the ring resonator 30. Note that for convenience's sake, a terminal part on one side of the optical waveguide 40a will be referred to as a port p1, the other terminal part on the other side will be referred to as a port p3, a terminal part on one side of the optical waveguide 40b will be referred to as a port p2, and the other terminal part on the other side will be referred to as a port p4, in the following description of this wavelength selection filter.

Among light incident on the port p1 of the optical waveguide 40a, light having a resonant wavelength of the ring resonator 30 passes through the ring resonator 30, and further propagates from the ring resonator 30 to the other optical waveguide 40b, to be emitted from the port p2. Also, light not having the resonant wavelengths of the ring resonator 30 propagates through the optical waveguide 40a as it is, to be emitted from the port p3.

Similarly, among light incident on the port p3 of the optical waveguide 40a, light having a resonant wavelength of the ring resonator 30 passes through the ring resonator 30, and further propagates from the ring resonator 30 to the other optical waveguide 40b, to be emitted from the port p4. Also, light not having the resonant wavelengths of the ring resonator 30 propagates through the optical waveguide 40a as it is, to be emitted from the port p1.

Similarly, among light incident on the port p2 of the other optical waveguide 40b, light having a resonant wavelength of the ring resonator 30 passes through the ring resonator 30, and further propagates from the ring resonator 30 to the optical waveguide 40a, to be emitted from the port p1. Also, light not having the resonant wavelengths of the ring resonator 30 propagates through the other optical waveguide 40b as it is, to be emitted from the port p4.

Similarly, among light incident on the port p4 of the other optical waveguide 40b, light having a resonant wavelength of the ring resonator 30 passes through the ring resonator 30, and further propagates from the ring resonator 30 to the optical waveguide 40a, to be emitted from the port p3. Also, light not having the resonant wavelengths of the ring resonator 30 propagates through the other optical waveguide 40b as it is, to be emitted from the port p2. Note that for light passing through the ring resonator, the resonance wavelengths are the same regardless of which port the light has been incident on.

In FIG. 6A, a dashed line designates "light to be selected", which is light having a resonant wavelength, and propagates, for example, from the optical waveguide 40a to the other optical waveguide 40b via the ring resonator 30. Also, a dashed-dotted line designates "light not to be selected", which is light other than the resonant wavelengths, and propagates, for example, through the optical waveguide 40a without passing through the ring resonator 30. In the present embodiment, light that propagates, for example, from the optical waveguide 40a to the other optical waveguide 40b via the ring resonator 30 may be referred to as "drop light", and light that propagates, for example, through the optical waveguide 40a without passing through the ring resonator 30 may be referred to as "through light".

Figure 6B:
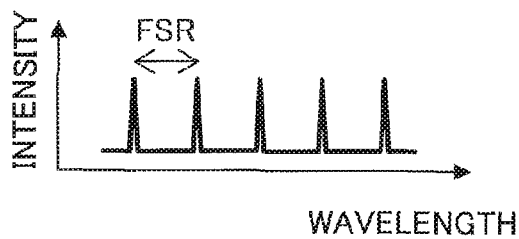
Figure 6C:
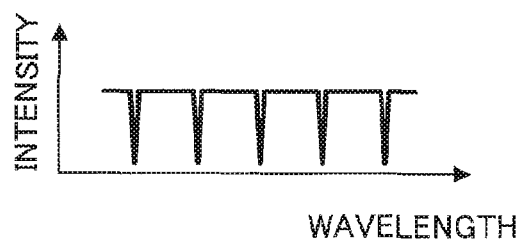

FIG. 6B illustrates a spectrum of the drop light as the light to be selected in the wavelength selection filter illustrated in FIG. 6A, and FIG. 6C illustrates a spectrum of the through light as the light not to be selected in FIG. 6A. As illustrated in FIG. 6B, this wavelength selection filter can select only the light having the resonant wavelengths that appear cyclically, to propagate the light from the optical waveguide 40a to the other optical waveguide 40b or from the other optical waveguide 40b to the optical waveguide 40a. Thus, light having a predetermined wavelength can be selected as the light to be selected. In the present embodiment, the cycle of such resonance wavelengths may be referred to as the "FSR (Free Spectrum Range)".

In the laser apparatus in the present embodiment, the first wavelength selection filter 51, the second wavelength selection filter 52, the third wavelength selection filter 53 are formed to have substantially the same structure as the wavelength selection filter illustrated in FIG. 6A.

(Operations of Laser Apparatus)

Next, operations of the laser apparatus in the present embodiment will be described. In the present embodiment, as illustrated in FIG. 7, the first ring resonator 31 and the third ring resonator 33 are formed to have respective FSRs slightly different from each other. Specifically, the first ring resonator 31 is formed to have the radius of 510 μm to obtain the FSR, whereas the third ring resonator 33 is formed to have the radius of 540 μm to obtain the FSR that is about 5% narrower than in the first ring resonator 31. Thus, the third ring resonator 33 is formed to have the FSR of 25 GHz. In such a case where the FSRs of the first ring resonator 31 and the third ring resonator 33 are slightly different from each other, laser oscillation occurs at a wavelength $\lambda_{13}$ at which a resonant wavelength of the first ring resonator 31 is coincident with a resonant wavelength of the third ring resonator 33 (Vernier effect). In the present embodiment, the laser light having the wavelength $\lambda_{13}$ is the first laser light.

Figure 8A:
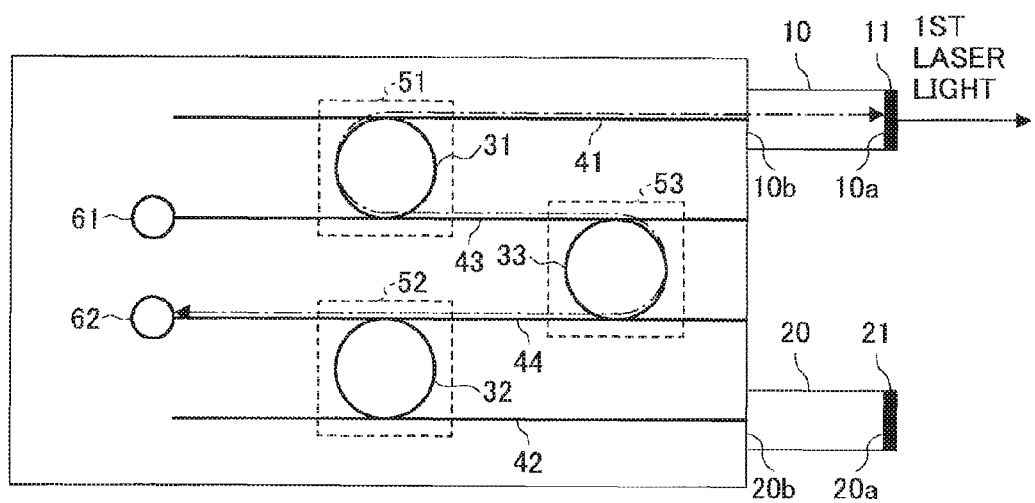
FIGS. 8A-8B are diagrams illustrating (2) of a laser apparatus in the first embodiment.

In other words, as illustrated in FIG. 8A, between the partially-reflecting mirror 11 formed on the one end surface 10a of the first SOA 10, and the second loop mirror 62, a first laser resonator is formed that emits the first laser light tracing an optical path designated by a dashed-dotted line. Specifically, the light having the wavelength $\lambda_{13}$ is light having a wavelength to be the drop light in the first wavelength selection filter 51 and the third wavelength selection filter 53. Therefore, the laser oscillation occurs on the optical path that goes through the first SOA 10, the first optical waveguide 41, the first ring resonator 31, the third optical waveguide 43, the third ring resonator 33, and the fourth optical waveguide 44, existing between the partially-reflecting mirror 11 and the second loop mirror 62.

Similarly, in the present embodiment, as illustrated in FIG. 7, the second ring resonator 32 and the third ring resonator 33 are formed to have respective FSRs slightly different from each other. Specifically, the second ring resonator 32 is formed to have the radius of 510 μm to obtain the FSR about 5% wider than the FSR of the third ring resonator 33. In such a case where the FSRs of the second ring resonator 32 and the third ring resonator 33 are slightly different from each other, laser oscillation occurs at a wavelength $\lambda_{23}$ at which a resonant wavelength of the second ring resonator 32 is coincident with a resonant wavelength of the third ring resonator 33. In the present embodiment, the laser light having the wavelength $\lambda_{23}$ is the second laser light.

Figure 8B:
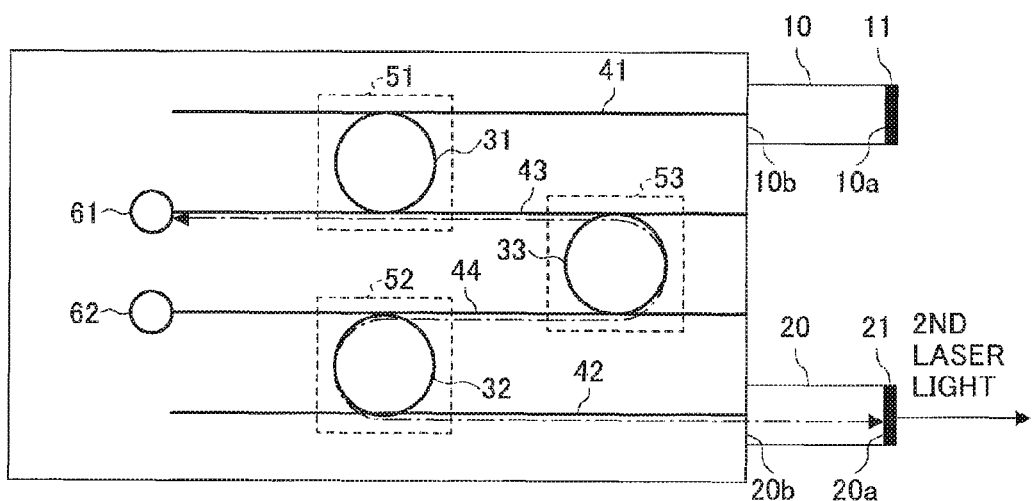

In other words, as illustrated in FIG. 8B, between the partially-reflecting mirror 21 formed on the one end surface 20a of the second SOA 20, and the first loop mirror 61, a second laser resonator is formed that emits the second laser light tracing an optical path designated by a dashed-dotted line. Specifically, the light having the wavelength $\lambda_{23}$ is light having a wavelength to be the drop light in the second wavelength selection filter 52 and the third wavelength selection filter 53. Therefore, the laser oscillation occurs on the optical path that goes through the second SOA 20, the second optical waveguide 42, the second ring resonator 32, the fourth optical waveguide 44, the third ring resonator 33, and the third optical waveguide 43, existing between the partially-reflecting mirror 21 and the first loop mirror 61.

Note that in the present embodiment, the wavelength $\lambda_{13}$ and the wavelength $\lambda_{23}$ are adjusted to be different from each other by the positions at which the ring resonators are formed, and heaters.

Next, the laser apparatus in the present embodiment will be described in detail based on FIG. 7.

The first laser light emitted from the one end surface 10a of the first SOA 10 is generated by laser oscillation that resonates the light emitted from the first SOA 10. Specifically, light emitted from the other end surface 10b of the first SOA 10 propagates through the first optical waveguide 41. Among the light, only light having a wavelength coincident with a resonant wavelength of the first ring resonator 31 passes through the first ring resonator 31 as the drop light, and light having other wavelengths becomes the through light. The light having passed through the first ring resonator 31 further propagates through the third optical waveguide 43, and among the light, only light having a wavelength coincident with a resonant wavelength of the third ring resonator 33 passes through the third ring resonator 33 as the drop light, and light having other wavelengths becomes the through light. In other words, among the light having the resonant wavelength that has become the drop light in the first ring resonator 31, only light having the wavelength $\lambda_{13}$ coincident with the resonant wavelength of the third ring resonator 33 passes through the third ring resonator 33 as the drop light, and light having other wavelengths becomes the through light.

Light having the wavelength $\lambda_{13}$ that has passed through the third ring resonator 33 further propagates through the fourth optical waveguide 44, and passes by the neighborhood of the second ring resonator 32. However, since the wavelength $\lambda_{13}$ coincident with the resonance wavelength of the first ring resonator 31 and the third ring resonator 33 is not a resonant wavelength of the second ring resonator 32, the light having the wavelength $\lambda_{13}$ does not pass through the second ring resonator 32, and becomes the through light in the second wavelength selection filter 52. Therefore, the light having the wavelength $\lambda_{13}$ is reflected by the second loop mirror 62 disposed at the one terminal part 44a of the fourth optical waveguide 44, and returns to the first SOA 10, tracing the same path.

Similarly, the second laser light emitted from the one end surface 20a of the second SOA 20 is generated by laser oscillation that resonates the light emitted from the second SOA 20. Specifically, light emitted from the other end surface 20b of the second SOA 20 propagates through the second optical waveguide 42. Among the light, only light having a wavelength coincident with a resonant wavelength of the second ring resonator 32 passes through the second ring resonator 32 as the drop light, and light having other wavelengths becomes the through light. The light having passed through the second ring resonator 32 further propagates through the fourth optical waveguide 44, and among the light, only light having a wavelength coincident with a resonant wavelength of the third ring resonator 33 passes through the third ring resonator 33 as the drop light, and light having other wavelengths becomes the through light. In other words, among the light having the resonant wavelength that has become the drop light in the second ring resonator 32, only light having the wavelength $\lambda_{23}$ coincident with the resonant wavelength of the third ring resonator 33 passes through the third ring resonator 33 as the drop light, and light having other wavelengths becomes the through light.

Light having the wavelength $\lambda_{23}$ that has passed through the third ring resonator 33 further propagates through the third optical waveguide 43, and passes by the neighborhood of the first ring resonator 31. However, since the wavelength $\lambda_{23}$ coincident with the resonance wavelength of the second ring resonator 32 and the third ring resonator 33 is not the resonant wavelength of the first ring resonator 31, the light having the wavelength $\lambda_{23}$ does not pass through the first ring resonator 31, and becomes the through light in the first wavelength selection filter 51. Therefore, the light having the wavelength $\lambda_{23}$ is reflected by the first loop mirror 61 disposed at the one terminal part 43a of the third optical waveguide 43, and returns to the second SOA 20, tracing the same path.

In this way, in the laser apparatus in the present embodiment, the light emitted from the first SOA 10 does not reach the second SOA 20, and the light emitted from the second SOA 20 does not reach the first SOA 10. Therefore, the laser light emitted from the first SOA 10 and the laser light emitted from the second SOA 20 have the wavelengths different from each other, and oscillate independently.

Also, both the light emitted from the other end surface 10b of the first SOA 10, and the light emitted from the other end surface 20b of the second SOA 20 pass the third ring resonator 33. Therefore, the oscillation wavelengths $\lambda_{13}$ and $\lambda_{23}$ coincide with respective resonant wavelengths of the third ring resonator 33. Therefore, the interval of oscillation wavelengths between the first laser resonator and the second laser resonator, namely, between the laser light emitted from the first SOA 10 and the laser light emitted from the second SOA 20 ($|\lambda_{13}-\lambda_{23}|$) is always an integer multiple of the FSR of the third ring resonator 33, and hence, the wavelength interval can be set correctly. For example, assuming that the FSR of the third ring resonator 33 is 25 GHz, the laser apparatus in the present embodiment emits laser light of two different wavelengths whose wavelength interval is an integer multiple of 25 GHz.

In addition, in the laser apparatus in the present embodiment, it is necessary to prevent the light having the wavelength $\lambda_{13}$ selected by the first ring resonator 31 and the third ring resonator 33, from passing through the second ring resonator 32. This is to make the first laser light emitted from the first SOA 10 and the second laser light emitted from the second SOA 20 independent from each other. Specifically, to have the wavelength $\lambda_{13}$ and the wavelength $\lambda_{23}$ take different wavelengths, the resonance wavelength of each of the ring resonators and the formed position may be adjusted, but actually, the finesse of each of the resonance wavelengths needs to be taken into consideration.

Here, as a case that requires the highest finesse, a case will be considered in which the wavelength $\lambda_{13}$ and the wavelength $\lambda_{23}$ are adjacent resonance wavelengths among the cyclic resonance wavelengths of the third ring resonator 33.

Assume that the FSR in the third ring resonator 33 is $\lambda$sp, the FSR of the first ring resonator 31 and the second ring resonator 32 is $\lambda\text{sp}+\Delta\lambda_\alpha$, and the wavelength $\lambda_{23}$ is one of the resonant wavelengths of the third ring resonator 33, adjacent to the wavelength $\lambda_{13}$ on the longer wavelength side. In this case, $\lambda_{23}=\lambda_{13}+\lambda\text{sp}$.

One of the resonant wavelengths of the second ring resonator 32 is coincident with $\lambda_{23}$, and a resonant wavelength of the second ring resonator 32 adjacent to $\lambda_{23}$ on the shorter wavelength side is $\lambda_{23}-(\lambda\text{sp}+\Delta\lambda_\alpha)=\lambda_{13}-\Delta\lambda_\alpha$.

Therefore, a resonant wavelength of the second ring resonator 32 closest to the wavelength $\lambda_{13}$ at which the resonant wavelength of the first ring resonator 31 and the resonant wavelength of the third ring resonator 33 coincide with each other, is a wavelength away from the wavelength $\lambda_{13}$ by $\Delta\lambda_\alpha$, which is the difference of the FSRs.

Figure 9:
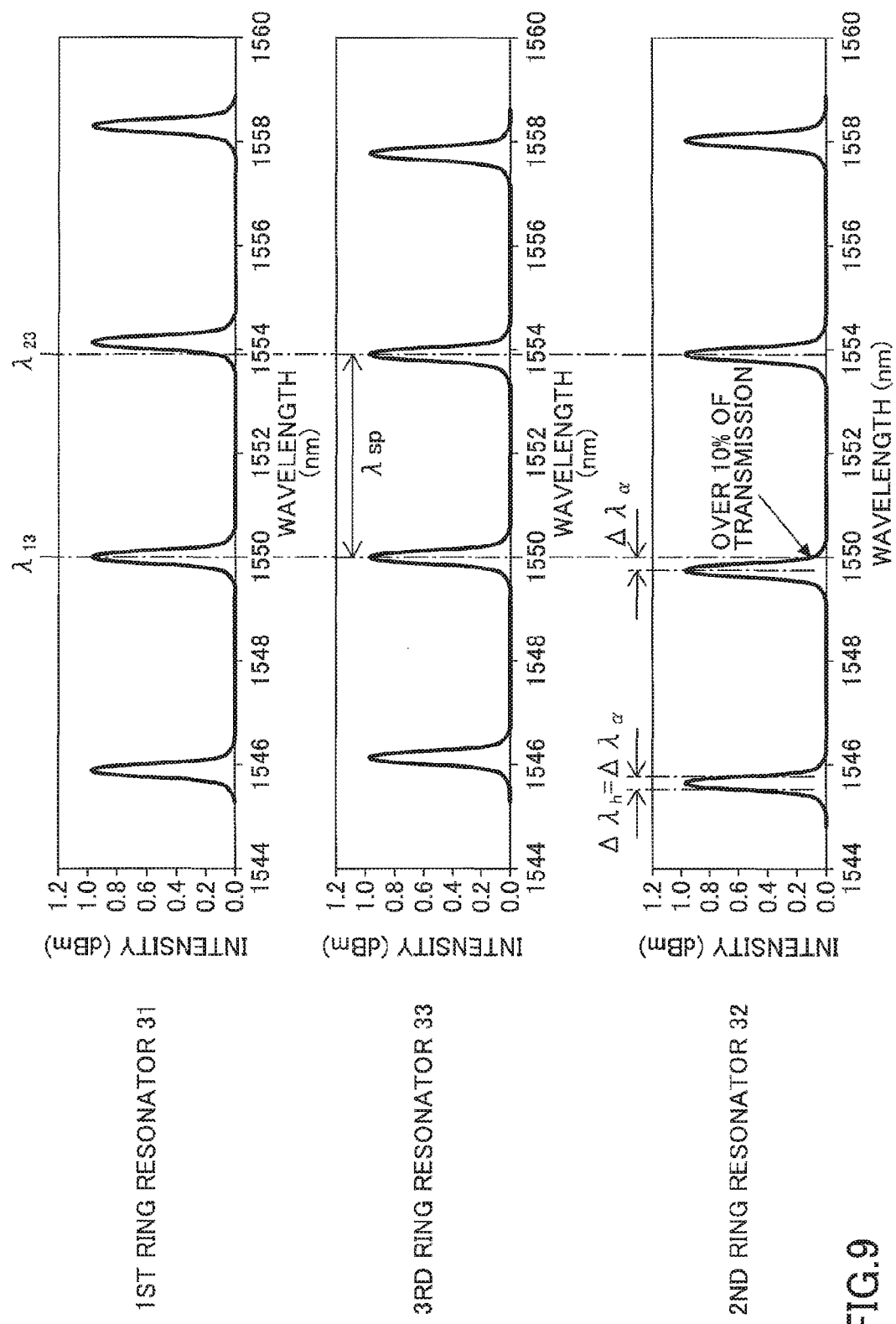
FIG. 9 is a diagram illustrating (3) of a laser apparatus in the first embodiment.

For example, a case in which the finesse of each ring resonator is low will be considered as illustrated in FIG. 9, a case in which the full width at half maximum (FWHM) represented by $\Delta\lambda_h$ of each resonance wavelength, is about the same as $\Delta\lambda_\alpha$. In this case, even if the peak of the resonant wavelength of the second ring resonator 32 is shifted by $\Delta\lambda_\alpha$ relative to the wavelength $\lambda_{13}$, over 10% of the light around the wavelength $\lambda_{13}$ becomes the drop light of the second ring resonator 32, to reach the second SOA 20. Therefore, it is difficult for the first laser resonator and the second laser resonator to operate independently.

Figure 10:
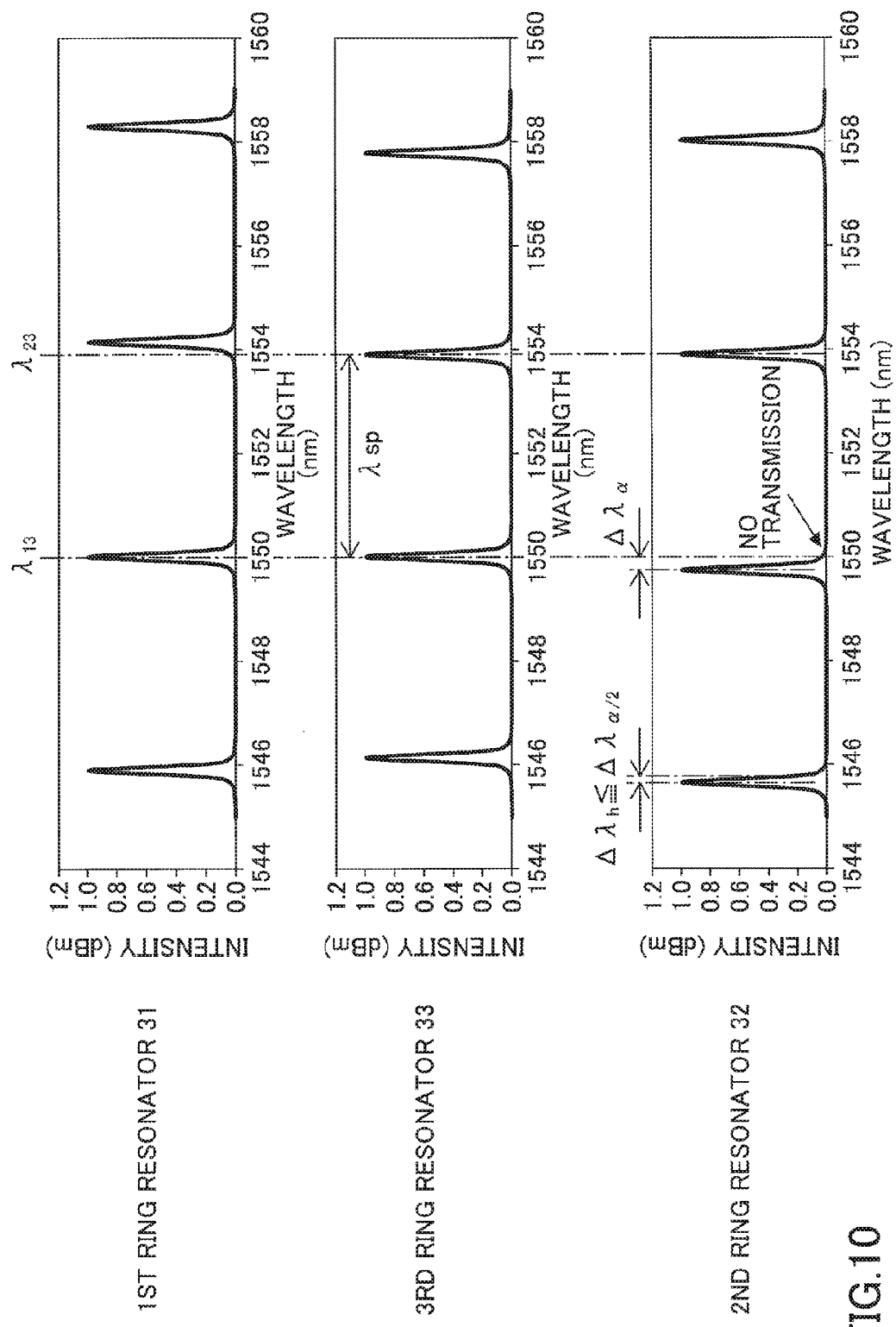
FIG. 10 is a diagram illustrating (4) of a laser apparatus in the first embodiment.

Therefore, to have the first laser resonator and the second laser resonator operate stably and independently, as illustrated in FIG. 10, it is preferable for the finesse of the resonance wavelength in each of the ring resonators to have a full width at half maximum $\Delta\lambda_h$ (FWHM) that is less than or equal to $\Delta\lambda_\alpha/2$.

Note that in the present embodiment, although it has been described that the first ring resonator 31, the second ring resonator 32, and the third ring resonator 33 are formed by the silicon waveguides, but it is not limited as such. For example, the first ring resonator 31, the second ring resonator 32, and the third ring resonator 33 may be formed by optical waveguides using quartz materials and optical waveguides using compound semiconductor materials such as InP. If these ring resonators are formed of compound semiconductor materials such as InP, the optical waveguides forming the ring resonators, and the first SOA 10 and the second SOA 20 can be integrated monolithically. Consequently, the laser apparatus can be downsized, and the implementation can be simplified.

Also, in the present embodiment, although it has been described that the FSRs of the first ring resonator 31 and the second ring resonator 32 are wider than the FSR of the third ring resonator 33, and the FSRs of the first ring resonator 31 and the second ring resonator 32 are the same, it is not limited as such. For example, the FSRs of the first ring resonator 31 and the second ring resonator 32 may be different from each other.

Note that if the FSRs of the first ring resonator 31 and the second ring resonator 32 are set equivalent, and a resonant wavelength of the first ring resonator 31 is set shifted from a resonant wavelength of the third ring resonator 33, the resonance wavelengths are generally shifted in other wavelength regions. Therefore, this case has an advantage that it is not necessary to consider coincidence of the resonance wavelengths between the first ring resonator 31 and the second ring resonator 32.

Also, it is preferable that the other terminal part of the first optical waveguide 41, the other terminal part of the second optical waveguide 42, the other terminal part of the third optical waveguide 43, and the other terminal part of the fourth optical waveguide 44 are processed not to be reflective.

Also, in addition to having the heater electrode formed at the ring part, each ring resonator may have a heater electrode for phase adjustment formed to adjust the laser resonator longitudinal mode position. For example, a first heater electrode for phase adjustment may be formed on the first optical waveguide 41 between the first SOA 10 and the first ring resonator 31, and a second heater electrode for phase adjustment may be formed on the second optical waveguide 42 between the second SOA 20 and the second ring resonator 32. Thus, the laser resonator longitudinal mode position can be adjusted in each of the first laser resonator and the second laser resonator, independently.

Second Embodiment

Figure 11:
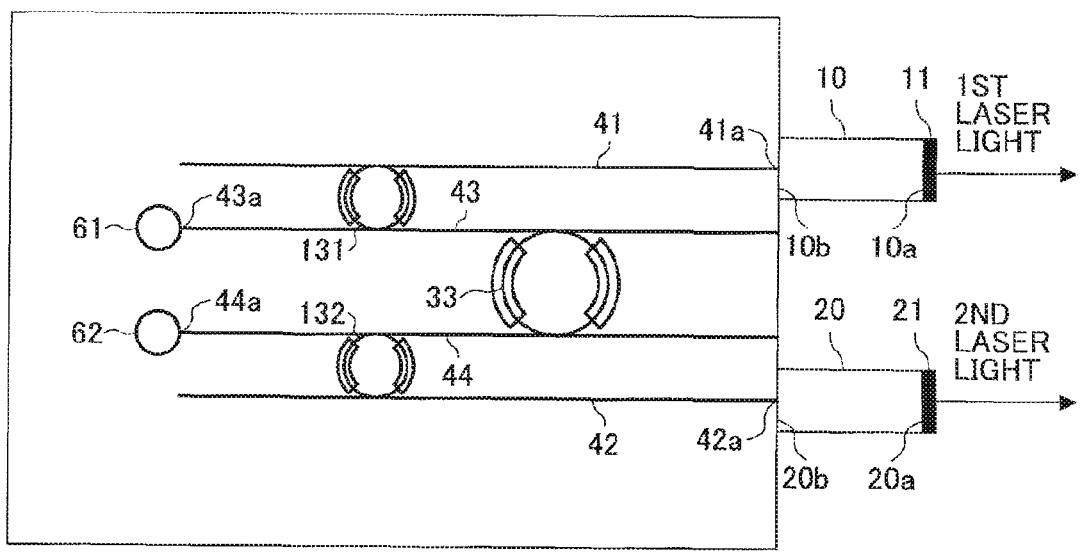
FIG. 11 is a structural diagram of a laser apparatus in a second embodiment.

Next, a second embodiment will be described. As illustrated in FIG. 11, a laser apparatus in the present embodiment has a structure in which the radius of a first ring resonator 131 and a second ring resonator 132 is formed smaller than in the first embodiment.

Figure 12:
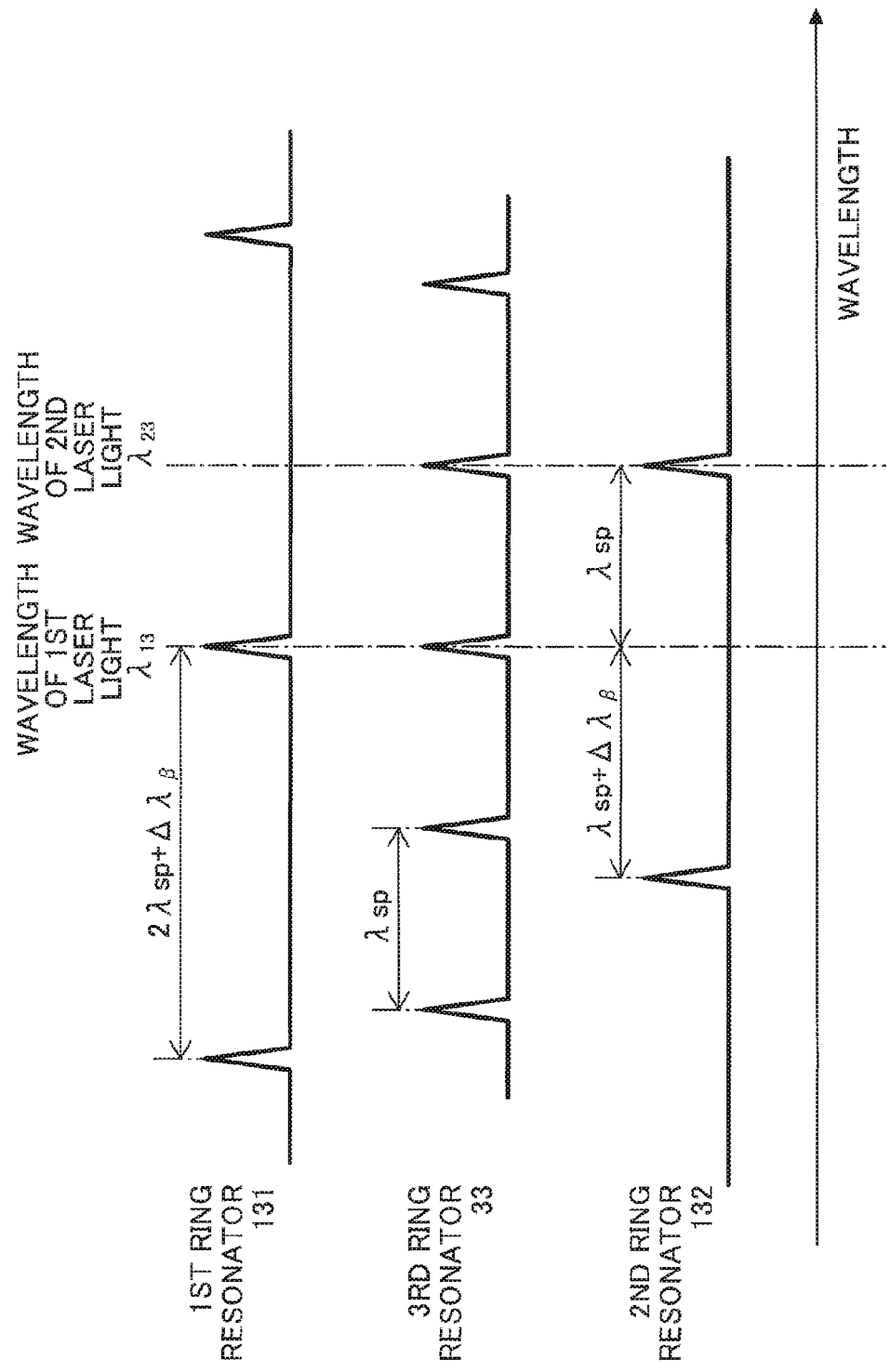
FIG. 12 is a diagram illustrating a laser apparatus in the second embodiment.

As illustrated in FIG. 12, in the laser apparatus in the present embodiment, the FSR of the third ring resonator 33 is $\lambda sp$, whereas the FSR of the first ring resonator 131 and the second ring resonator 132 is $2\lambda sp+\Delta\lambda_\beta$. In other words, in the first embodiment, the FSR of the first ring resonator 31 and the second ring resonator 32 are slightly shifted from the FSR of the third ring resonator 33, whereas in the present embodiment, the FSR of the first ring resonator 131 and the second ring resonator 132 are slightly shift from the double of the FSR of the third ring resonator 33. Note that the FSR of the first ring resonator 131 and the second ring resonator 132 in the present embodiment may be minutely shifted from an integer multiple of the FSR of the third ring resonator 33. The third ring resonator 33 is formed to have the radius of 540 μm to obtain the FSR of 25 GHz, whereas the first ring resonator 131 and the second ring resonator 132 are formed to have the radius of 265 μm to obtain the FSR of 51.25 GHz. Note that the FSR of 51.25 GHz is equivalent to 25 GHz×2+1.25 GHz.

Here, as in the first embodiment, a case will be considered in which the wavelength $\lambda_{13}$ and the wavelength $\lambda_{23}$ are the resonant wavelengths of the third ring resonator 33 adjacent to each other. Assuming that the wavelength $\lambda_{23}$ is one of the resonant wavelengths of the third ring resonator 33 that is adjacent to the wavelength $\lambda_{13}$ on the longer wavelength side, it implies that $\lambda_{23}=\lambda_{13}+\lambda sp$. One of the resonant wavelengths of the second ring resonator 132 coincides with the wavelength $\lambda_{23}$, and a resonant wavelength of the second ring resonator 132 adjacent to $\lambda_{23}$ on the shorter wavelength side is represented by $\lambda_{23}-(2\times\lambda sp+\Delta\lambda_\beta)=\lambda_{13}-\lambda sp-\Delta\lambda_\beta$. Therefore, a resonant wavelength of the second ring resonator 132 closest to the wavelength $\lambda_{13}$ is either the wavelength $(\lambda_{13}-\lambda sp-\Delta\lambda_\beta)$ or the wavelength $\lambda_{23}$, and either one is a wavelength away from the wavelength $\lambda_{13}$ by $\lambda sp$ or greater.

In the first embodiment, this wavelength difference is slight, for example, $\Delta\lambda_\beta$, whereas in the present embodiment, the wavelength difference is $\lambda sp+\Delta\lambda_\beta$. Since $\lambda sp$ is much greater than $\Delta\lambda_\beta$ ($\lambda sp>>\Delta\lambda_\beta$), the amount of shift of the resonant wavelength of the second ring resonator 132 relative to the wavelength $\lambda_{13}$ is greater in the present embodiment compared to the first embodiment, and hence, the requirement for the finesse of each ring resonator can be relaxed considerably.

Note that if the wavelength difference between the wavelength $\lambda_{13}$ and the wavelength $\lambda_{23}$ is set to $2\times\lambda sp$, or an integer multiple of that (even multiple of $\lambda sp$), the difference between the wavelength $\lambda_{13}$ and the resonant wavelength of the second ring resonator 132 is $\Delta\lambda_\beta$ as in the first embodiment. Therefore, in the present embodiment, it is preferable that the wavelength interval between the wavelength $\lambda_{13}$ and the wavelength $\lambda_{23}$ is set to an odd multiple of $\lambda sp$.

Note that in the present embodiment, although a case has been described in which the FSR of the first ring resonator 131 and the second ring resonator 132 is about twice greater than the FSR of the third ring resonator 33, it is not limited as such. For example, the FSR of the first ring resonator 131 and the second ring resonator 132 may be about N times greater than the FSR of the third ring resonator 33, namely, $N\times\lambda sp+\Delta\lambda_\beta$ where N is a natural number. With a large value of N, except for a case in which the wavelength difference between the wavelength $\lambda_{13}$ and the wavelength $\lambda_{23}$ is $N\times\lambda sp$, the wavelength difference between the wavelength $\lambda_{13}$ and a resonant wavelength of the second ring resonator 132 is greater than or equal to $\lambda sp$, the requirement for the finesse of each ring resonator can be relaxed.

Note that the contents other than the above are the same as in the first embodiment.

Third Embodiment

Next, a third embodiment will be described. The present embodiment relates to a laser apparatus having a structure in which both a first wavelength selection filter and a second wavelength selection filter are formed with multiple ring resonators.

Figure 13:
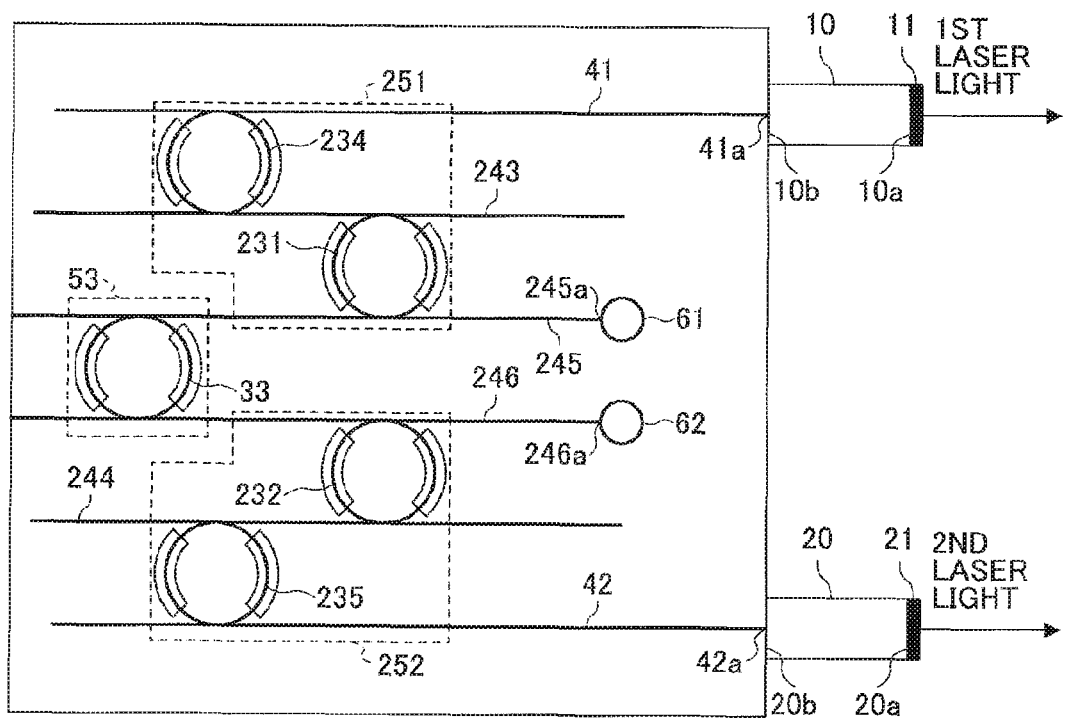
FIG. 13 is a structural diagram of a laser apparatus according to a third embodiment.

As illustrated in FIG. 13, the laser apparatus in the present embodiment includes a first SOA 10, a second SOA 20, a first ring resonator 231, a second ring resonator 232, a third ring resonator 33, a fourth ring resonator 234, and a fifth ring resonator 235.

In the laser apparatus in the present embodiment, first laser light is emitted from one end surface 10a of the first SOA 10, and second laser light is emitted from one end surface 20a of the second SOA 20.

The first ring resonator 231, the second ring resonator 232, the third ring resonator 33, the fourth ring resonator 234, and the fifth ring resonator 235 are formed by silicon waveguides formed on a silicon substrate. On this silicon substrate, a first optical waveguide 41, a second optical waveguide 42, a third optical waveguide 243, a fourth optical waveguide 244, a fifth optical waveguide 245, and a sixth optical waveguide 246 are formed by silicon waveguides.

The first SOA 10 is disposed so that the light is emitted from, and incident on, between the other end surface 10b of the first SOA 10, and one terminal part 41a of the first optical waveguide 41. Note that it is preferable that the one terminal part 41a of the first optical waveguide 41 has a spot-size converter formed (not illustrated) so as to raise the optical coupling efficiency with the first SOA 10.

The second SOA 20 is disposed so that the light is emitted from, and incident on, between the other end surface 20b of the second SOA 20, and one terminal part 42a of the second optical waveguide 42. Note that it is preferable that the one terminal part 42a of the second optical waveguide 42 has a spot-size converter formed (not illustrated) so as to raise the optical coupling efficiency with the second SOA 20.

The fourth ring resonator 234 is formed between the first optical waveguide 41 and the third optical waveguide 243, the fourth ring resonator 234 and the first optical waveguide 41 are placed close to each other, and the fourth ring resonator 234 and the third optical waveguide 243 are placed close to each other.

The first ring resonator 231 is formed between the third optical waveguide 243 and the fifth optical waveguide 245, the first ring resonator 231 and the third optical waveguide 243 are placed close to each other, and the first ring resonator 231 and the fifth optical waveguide 245 are placed close to each other.

The fifth ring resonator 235 is formed between the second optical waveguide 42 and the fourth optical waveguide 244, the fifth ring resonator 235 and the second optical waveguide 42 are placed close to each other, and the fifth ring resonator 235 and the fourth optical waveguide 244 are placed close to each other.

The second ring resonator 232 is formed between the fourth optical waveguide 244 and the sixth optical waveguide 246, the second ring resonator 232 and the fourth optical waveguide 244 are placed close to each other, and the second ring resonator 232 and the sixth optical waveguide 246 are placed close to each other.

The third ring resonator 33 is formed between the fifth optical waveguide 245 and the sixth optical waveguide 246, the third ring resonator 33 and the fifth optical waveguide 245 are placed close to each other, and the third ring resonator 33 and the sixth optical waveguide 246 are placed close to each other.

Also, one terminal part 245a of the fifth optical waveguide 245 has a first loop mirror 61 formed, and one terminal part 246a of the sixth optical waveguide 246 has a second loop mirror 62 formed. Note that the first loop mirror 61 and the second loop mirror 62 are also formed by silicon waveguides formed on the silicon substrate.

In the present embodiment, a first wavelength selection filter 251 is formed with the first ring resonator 231, the fourth ring resonator 234, the first optical waveguide 41 close to these ring resonators, the third optical waveguide 243, and the fifth optical waveguide 245. Also, a second wavelength selection filter 252 is formed with the second ring resonator 232, the fifth ring resonator 235, the second optical waveguide 42 close to these ring resonators, the fourth optical waveguide 244, and the sixth optical waveguide 246. Also, a third wavelength selection filter 53 is formed with the third ring resonator 33, and the fifth optical waveguide 245 and the sixth optical waveguide 246 close to the third ring resonator 33.

In the present embodiment, the FSRs of the first ring resonator 231 and the second ring resonator 232 are slightly shifted from the FSR of the third ring resonator 33. Also, the resonant wavelengths of the fourth ring resonator 234 are slightly shifted from the resonant wavelengths of the first ring resonator 231, and the resonant wavelengths of the fifth ring resonator 235 are slightly shifted from the resonant wavelengths of the second ring resonator 232.

In the present embodiment, the first wavelength selection filter 251 may be regarded as the first wavelength selection filter 51 in the first embodiment, and the second wavelength selection filter 252 may be regarded as the second wavelength selection filter 52 in the first embodiment. In other words, the laser apparatus in the present embodiment has a structure in which the first wavelength selection filter 251 is formed with multiple ring resonators, and the second wavelength selection filter 252 is formed with multiple ring resonators.

(Wavelength Selection Filter)

Next, a wavelength selection filter using ring resonators, which is used for the laser apparatus in the present embodiment, will be described based on FIGS. 14A-14C. As illustrated in FIG. 14A, this wavelength selection filter includes a ring resonator 230a, a ring resonator 230b, and optical waveguides 240a, 240b, and 240c placed close to the ring resonator 230a or the ring resonator 230b. Specifically, the ring resonator 230a is formed between the optical waveguide 240a and the optical waveguide 240b, and placed close to the optical waveguide 240a and the optical waveguide 240b. Also, the ring resonator 230b is formed between the optical waveguide 240b and an optical waveguide 240c, and placed close to the optical waveguide 240b and the optical waveguide 240c. Note that for convenience's sake, a terminal part on one side of the optical waveguide 240a will be referred to as a port p1, the other terminal part on the other side will be referred to as a port p3, a terminal part on one side of the optical waveguide 240c will be referred to as a port p4, and the other terminal part on the other side will be referred to as a port p2, in the following description of this wavelength selection filter.

Among light incident on the port p1 of the optical waveguide 240a, light having a resonant wavelength of the ring resonator 230a propagates to the optical waveguide 240b via the ring resonator 230a. Further, among the light having propagated to the optical waveguide 240b, light having a resonant wavelength the ring resonator 230b propagates through the optical waveguide 240c via the ring resonator 230b, to be emitted from the port p2. Also, light not having the resonant wavelengths of the ring resonator 230a propagates through the optical waveguide 240a as it is, to be emitted from the port p3.

Similarly, among light incident on the port p2 of the optical waveguide 240b, light having a resonant wavelength of the ring resonator 230b propagates to the optical waveguide 240b via the ring resonator 230b. Further, among the light having propagated to the optical waveguide 240b, light having a resonant wavelength the ring resonator 230a propagates through the optical waveguide 240a via the ring resonator 230a, to be emitted from the port p1. Also, light not having the resonant wavelengths of the ring resonator 230b propagates through the optical waveguide 240b as it is, to be emitted from the port p4.

In FIG. 14A, a dashed line designates "light to be selected", which is light having the resonant wavelength, and propagates, for example, from the optical waveguide 240a to the optical waveguide 240c via the ring resonator 230a, the optical waveguide 240b, and the ring resonator 230b. Also, a dashed-dotted line designates "light not to be selected", which is light other than the resonant wavelengths, and propagates, for example, only through the optical waveguide 240a without passing through the ring resonator 230a.

FIG. 14B illustrates a spectrum of the light to be selected in the wavelength selection filter illustrated in FIG. 14A, and FIG. 14C illustrates a spectrum of the through light as the light not to be selected in FIG. 14A. As illustrated in FIG. 14B, the wavelength selection filter illustrated in FIG. 14A can select only the light having a wavelength that coincides with a resonance wavelength in the ring resonator 230a and a resonance wavelength in the ring resonator 230b.

The first wavelength selection filter 251 and the second wavelength selection filter 252 used in the laser apparatus in the present embodiment, have substantially the same structure as the wavelength selection filter illustrated in FIG. 14A.

Also in the present embodiment, the first SOA 10 corresponds to a first gain medium, and between the partially-reflecting mirror 11 formed on the one end surface 10a of the first SOA 10, and the second loop mirror 62, a first laser resonator is formed that emits the first laser light. Also, the second SOA 20 corresponds to a second gain medium, and between the partially-reflecting mirror 21 formed on the one end surface 20a of the second SOA 20, and the first loop mirror 61, a second laser resonator is formed that emits the second laser light. Thus, the laser light having different wavelengths from each other can be emitted independently.

Disposed on the optical path in the first laser resonator are the fourth ring resonator 234, the first ring resonator 231, the third ring resonator 33 that have respective FSRs slightly shifted from each other, and due to the Vernier effect, laser oscillation occurs at a wavelength $\lambda_{134}$ at which the resonance wavelengths of these three ring resonators coincide with each other. Disposed on the optical path in the second laser resonator are the fifth ring resonator 235, the second ring resonator 232, and the third ring resonator 33 that have respective FSRs slightly shifted from each other, and due to the Vernier effect, laser oscillation occurs at a wavelength $\lambda_{235}$ at which the resonance wavelengths of these three ring resonators coincide with each other.

Compared to a case in which the oscillation wavelength is selected by two ring resonators as in the first embodiment, the oscillation wavelength is selected by three ring resonators in the present embodiment, and hence, a single wavelength can be selected much more steeply, and single mode oscillation is easier to realize. In other words, the first wavelength selection filter 251 including the fourth ring resonator 234 and the first ring resonator 231 is a wavelength selection filter to select virtually a single wavelength as the selected wavelength due to the Vernier effect of the two ring resonators. Further, among selected wavelengths in the first wavelength selection filter 251, a wavelength that coincides with one of the cyclic resonance wavelengths of the third ring resonator 33 is selected. Thus, it is possible to select a single wavelength much more steeply. Similarly, the second wavelength selection filter 252 including the fifth ring resonator 235 and the second ring resonator 232 is a wavelength selection filter to select virtually a single wavelength as the selected wavelength due to the Vernier effect of the two ring resonators. Further, among selected wavelengths in the second wavelength selection filter 252, a wavelength that coincides with one of the cyclic resonance wavelengths of the third ring resonator 33 is selected. Thus, it is possible to select a single wavelength much more steeply.

Also, since $\lambda_{134}$ being the oscillation frequency of the first laser resonator is different from a resonant wavelength of the second ring resonator 232, light having the wavelength $\lambda_{134}$ does not become the drop light in the second ring resonator 232, and does not reach the second SOA 20. Further, in the present embodiment, an additional stage of wavelength selection executed by the fifth ring resonator 235 disposed between the second ring resonator 232 and the second SOA 20, makes it even more difficult for light emitted from the first SOA 10 to reach the second SOA 20.

Similarly, since $\lambda_{235}$ being the oscillation frequency of the second laser resonator is different from a resonant wavelength of the first ring resonator 231, light having the wavelength $\lambda_{235}$ does not become the drop light in the first ring resonator 231, and does not reach the first SOA 10. Further, in the present embodiment, an additional stage of wavelength selection executed by the fourth ring resonator 234 disposed between the first ring resonator 231 and the first SOA 10, makes it even more difficult for light emitted from the second SOA 20 to reach the first SOA 10. Thus, the laser oscillation can be executed even more independently between the first laser resonator and the second laser resonator.

In the description of the present embodiment, each of the first wavelength selection filter 251 and the second wavelength selection filter 252 is a wavelength selection filter to select one wavelength by two ring resonators that are combined, but it is not limited as such.

For example, substantially the same effect can be obtained by a wavelength selection filter that has input/output ports p1 to p4, and has characteristics in that light having a selected wavelength propagates between p1 and p2, and a part of light not to be selected not having the selected wavelength propagates between p1 and p3 or between p2 and p4.

In the laser apparatus in the present embodiment, a filter to select a single wavelength is used in each of the first wavelength selection filter 251 and the second wavelength selection filter 252. Therefore, the wavelength to be selected in the first wavelength selection filter 251 is only the oscillation wavelength in the first laser oscillator, and the wavelength to be selected in the second wavelength selection filter 252 is only the oscillation wavelength in the second laser oscillator. Therefore, compared to a case that uses a wavelength selection filter having multiple resonance wavelengths, light having a wavelength other than the wavelength to be selected does not propagate in the filters in the present embodiment. Therefore, it is easier for the first laser resonator and the second laser resonator to operate independently.

Note that the contents other than the above are the same as in the first embodiment.

Fourth Embodiment

Figure 15:
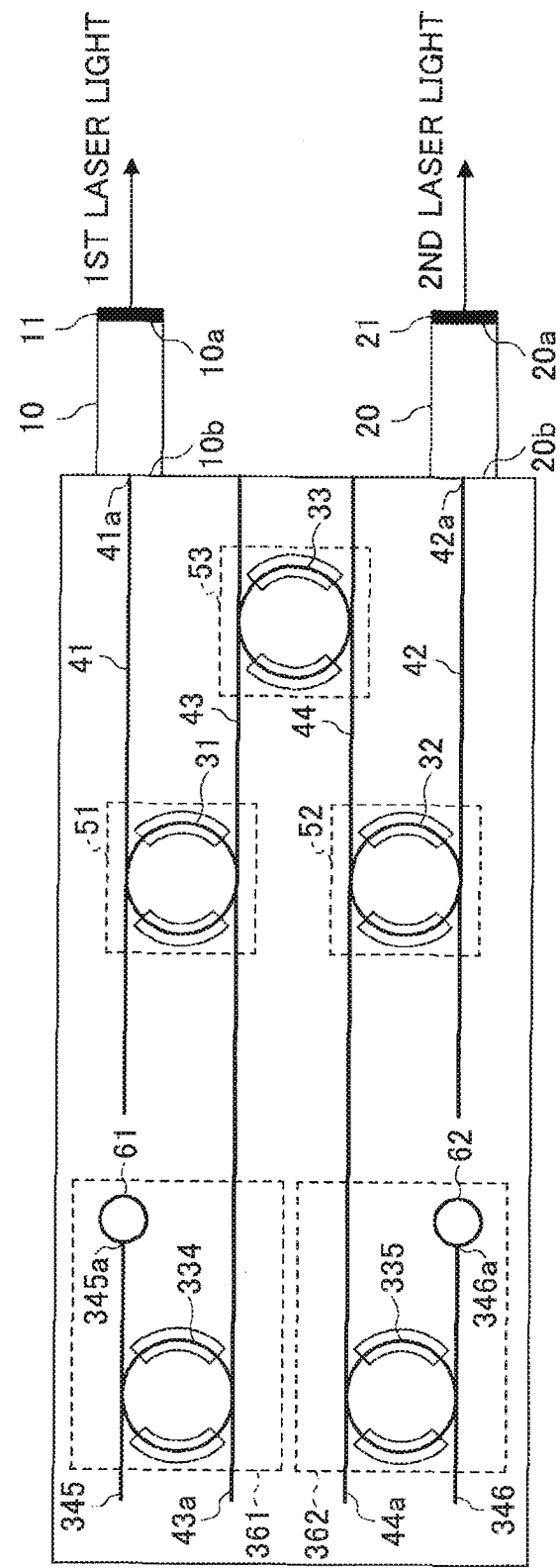
FIG. 15 is a structural diagram of a laser apparatus according to a fourth embodiment.

Next, a fourth embodiment will be described. As illustrated in FIG. 15, a laser apparatus in the present embodiment includes elements in the first embodiment, and in addition, a fourth ring resonator 334, a fifth ring resonator 335, a fifth optical waveguide 345, and a sixth optical waveguide 346.

The fourth ring resonator 334 is formed between the third optical waveguide 43 and the fifth optical waveguide 345, the fourth ring resonator 334 and the third optical waveguide 43 are placed close to each other, and the fourth ring resonator 334 and the fifth optical waveguide 345 are placed close to each other. The fourth ring resonator 334 is formed in the neighborhood of the one terminal part 43a of the third optical waveguide 43, and the first loop mirror 61 is formed at one terminal part 345a of the fifth optical waveguide 345.

The fifth ring resonator 335 is formed between the fourth optical waveguide 44 and the sixth optical waveguide 346, the fifth ring resonator 335 and the fourth optical waveguide 44 are placed close to each other, and the fifth ring resonator 335 and the sixth optical waveguide 346 are placed close to each other. The fifth ring resonator 335 is formed in the neighborhood of the one terminal part 44a of the fourth optical waveguide 44, and a second loop mirror 62 is formed at one terminal part 346a of the sixth optical waveguide 346.

As such, in the first laser resonator, the fifth ring resonator 335 is disposed between the third ring resonator 33 and the second loop mirror 62. Also, in the second laser resonator, the fourth ring resonator 334 is disposed between the third ring resonator 33 and the first loop mirror 61.

Therefore, also in the present embodiment, the first SOA 10 corresponds to a first gain medium, and between the partially-reflecting mirror 11 formed on the one end surface 10a of the first SOA 10, and the second loop mirror 62, a first laser resonator is formed that emits the first laser light. Also, the second SOA 20 corresponds to a second gain medium, and between the partially-reflecting mirror 21 formed on the one end surface 20a of the second SOA 20, and the first loop mirror 61, a second laser resonator is formed that emits the second laser light. Thus, the laser light having different wavelengths from each other can be emitted independently.

In the laser apparatus in the present embodiment, a first wavelength selection mirror 361 is formed with the fourth ring resonator 334 and the first loop mirror 61, and a second wavelength selection mirror 362 is formed with the fifth ring resonator 335 and the second loop mirror 62.

In the present embodiment, the resonant wavelengths of the first ring resonator 31, the second ring resonator 32, and the third ring resonator 33 are set in the same way as in the first embodiment. Therefore, the wavelength $\lambda_{13}$ is a wavelength at which a resonant wavelength of the first ring resonator 31 and a resonant wavelength of the third ring resonator 33 coincide with each other, and the wavelength $\lambda_{23}$ is a wavelength at which a resonant wavelength of the second ring resonator 32 and a resonant wavelength of the third ring resonator 33 coincide with each other.

In the present embodiment, it is formed such that the resonant wavelengths of the fifth ring resonator 335 in the second wavelength selection mirror 362 includes the wavelength $\lambda_{13}$, but does not include the wavelength $\lambda_{23}$. Also, it is formed such that the resonant wavelengths of the fourth ring resonator 334 in the first wavelength selection mirror 361 includes the wavelength $\lambda_{23}$, but does not include the wavelength $\lambda_{13}$. For example, it may be formed such that the resonant wavelengths of the fourth ring resonator 334 are equivalent to the resonant wavelengths of the second ring resonator 32, and the resonant wavelengths of the fifth ring resonator 335 are equivalent to the resonant wavelengths of the first ring resonator 31.

In the present embodiment, the wavelength of laser light emitted from the first laser resonator is a wavelength at which resonant wavelengths of the first ring resonator 31, the third ring resonator 33, and the fifth ring resonator 335 coincide with each other. Also, the wavelength of laser light emitted from the second laser resonator is a wavelength at which resonant wavelengths of the second ring resonator 32, the third ring resonator 33, and the fourth ring resonator 334 coincide with each other. In the present embodiment, both the first laser resonator and the second laser resonator use three ring resonators for the wavelength selection. Therefore, compared to the first embodiment, the wavelength selection becomes sharper, and the single mode oscillation becomes easier.

Also, since the second wavelength selection mirror 362 forming the first laser resonator does not reflect light having the wavelength $\lambda_{23}$ being the oscillation wavelength of the second laser resonator, unnecessary resonance of the light having the wavelength $\lambda_{23}$ can be prevented in the first laser resonator. Similarly, since the first wavelength selection mirror 361 forming the second laser resonator does not reflect light having the wavelength $\lambda_{13}$ being the oscillation wavelength of the first laser resonator, unnecessary resonance of the light having the wavelength $\lambda_{13}$ can be prevented in the second laser resonator. Therefore, independent between the first laser light and the second laser light can be improved even more in the laser apparatus in the present embodiment.

Note that the contents other than the above are the same as in first embodiment.

Fifth Embodiment

Figure 16:
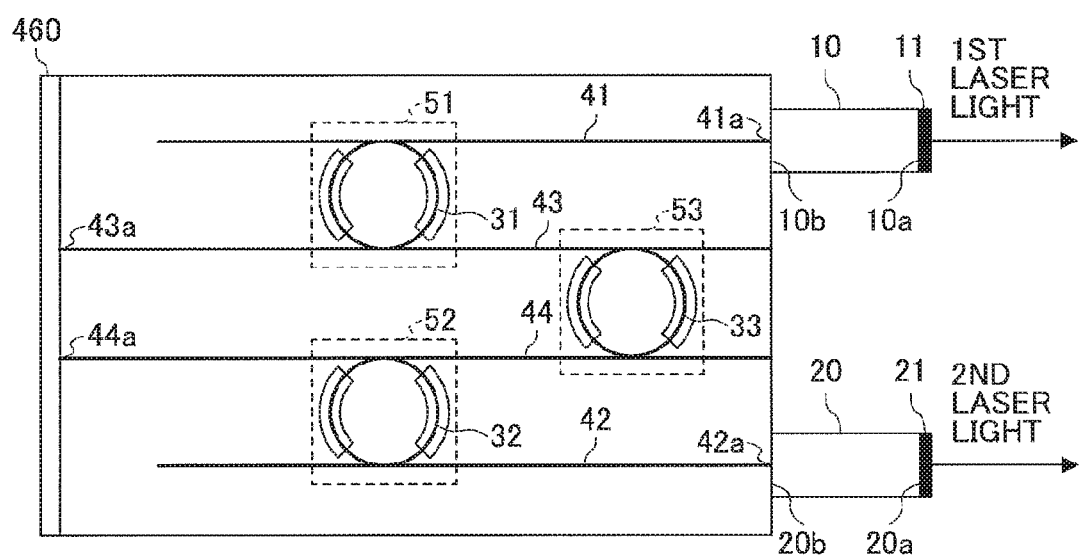
FIG. 16 is a structural diagram of a laser apparatus according to a fifth embodiment.

Next, a fifth embodiment will be described. As illustrated in FIG. 16, the laser apparatus in the present embodiment has basically the same structure as the laser apparatus in the first embodiment, except that a high-reflecting mirror 460 is formed on the end surface, instead of the first loop mirror 61 and the second loop mirror 62. The high-reflecting mirror 460 is formed to cover the one terminal part 43a of the third optical waveguide 43 and the one terminal part 44a of the fourth optical waveguide 44. The high-reflecting mirror 460 may be formed by forming a film such as a dielectric multi-layer film on the end surface at the one terminal part 43a of the third optical waveguide 43, and the one terminal part 44a of the fourth optical waveguide 44.

Note that the contents other than the above are the same as in first embodiment.

Sixth Embodiment

Figure 17:
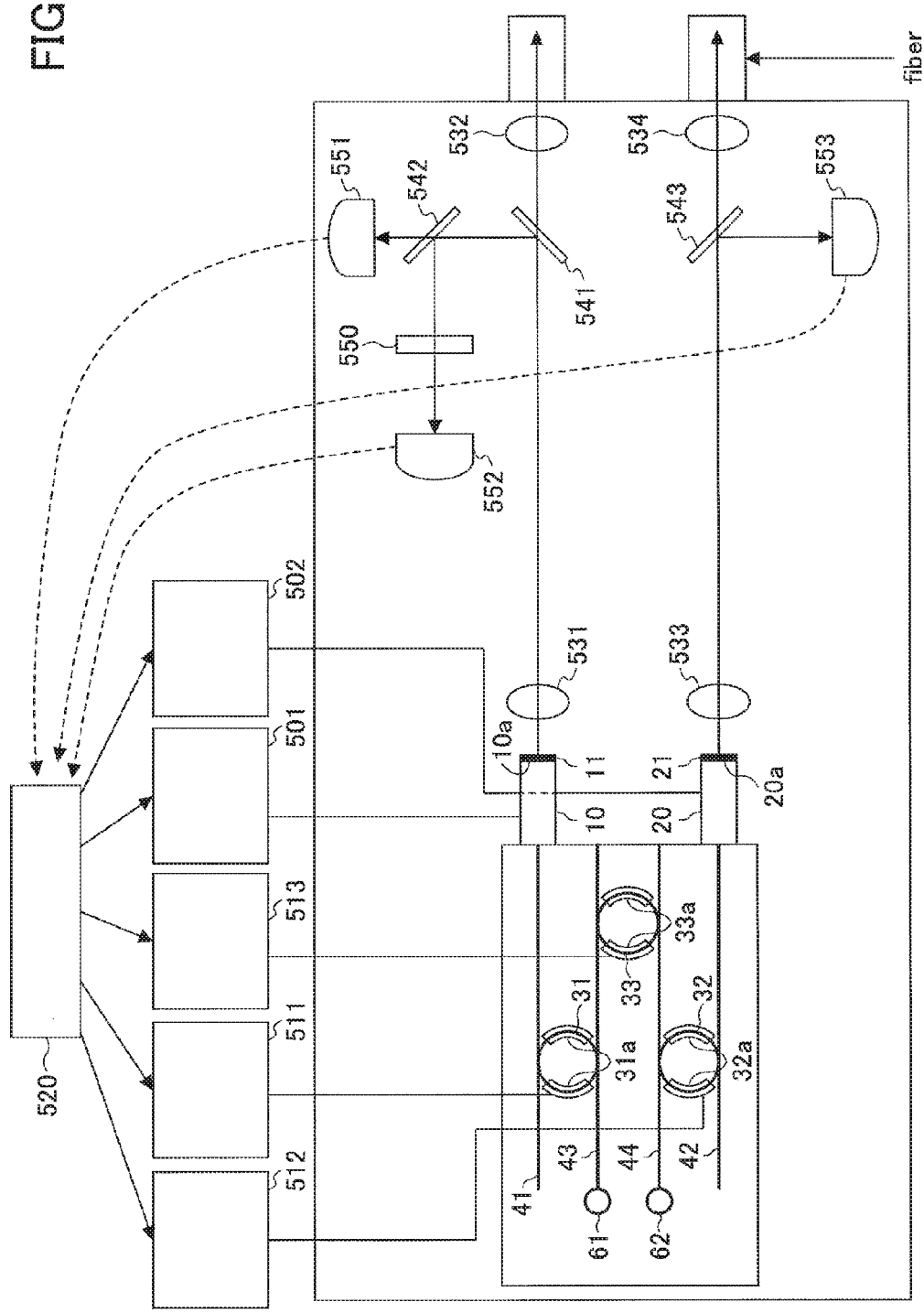
FIG. 17 is a structural diagram of a laser apparatus according to a sixth embodiment.

Next, a sixth embodiment will be described. A laser module in the present embodiment is a variable wavelength laser module that includes a laser apparatus in the first embodiment. Specifically, as illustrated in FIG. 17, the laser module includes a laser apparatus according to the first embodiment, a first SOA power source 501, a second SOA power source 502, a first heater power source 511, a second heater power source 512, a third heater power source 513, and a controller 520.

The first SOA power source 501 is a power source for driving the first SOA 10 in the laser apparatus according to the first embodiment, and the second SOA power source 502 is a power source for driving the second SOA 20.

The first heater power source 511 is connected with the heater electrode 31a of the first ring resonator 31, and by flowing a current in the heater electrode 31a to be heated, the resonant wavelength of the first ring resonator 31 can be changed minutely to be adjusted. The second heater power source 512 is connected with the heater electrode 32a of the second ring resonator 32, and by flowing a current in the heater electrode 32a to be heated, the second ring resonator 32 can be changed minutely to be adjusted. The third heater power source 513 is connected with the heater electrode 33a of the third ring resonator 33, and by flowing a current in the heater electrode 33a to be heated, the third ring resonator 33 can be changed minutely to be adjusted.

The controller 520 serving as a control unit is connected with the first SOA power source 501, the second SOA power source 502, the first heater power source 511, the second heater power source 512, and the third heater power source 513, to control these elements.

The laser module in the present embodiment also includes lenses 531, 532, 533, and 534, a first beam splitter 541, a second beam splitter 542, a third beam splitter 543, and an etalon 550. The laser module in the present embodiment further includes a first photodetector 551, a second photodetector 552, and a third photodetector 553. Note that, the first photodetector 551, the second photodetector 552, and the third photodetector 553 are formed with photodiodes.

The first laser light oscillated in the first laser resonator and emitted from the one end surface 10a of the first SOA 10 goes through the lens 531, and is split into transmitting laser light and reflected laser light, for example, by the ratio of 10:1 at the first beam splitter 541. The laser light having reflected at the first beam splitter 541 is incident on the second beam splitter 542, and is split into transmitting laser light and reflected laser light, for example, by the ratio of 1:1 at the second beam splitter 542. The laser light having passed through second beam splitter 542 is incident on the first photodetector 551 by which the amount of the light is detected, and laser light having passed through the etalon 550 among the laser light having reflected in the second beam splitter 542 is incident on the second photodetector 552 by which the amount of the light is detected.

Note that the etalon 550 is an etalon for locking wavelength, has the FSR of 50 GHz, has a transmission characteristic close to a sine wave with respect to light having a predetermined wavelength, and the peak wavelength of light passing through the etalon 550 is adjusted to the center of two grids of ITU-T grids having the interval of 25 GHz. In other words, the etalon 550 is formed to have a 25 GHz ITU-T grid come to the middle point of the peak and the bottom of the light passing through the etalon 550.

The laser apparatus in the present embodiment controls the current in the first SOA 10 based on a value detected by the first photodetector 551, and hence, can emit the first laser light having a desired intensity. Also, the laser apparatus also controls the current flowing in the heater electrode 31a of the first ring resonator 31 and the heater electrode 33a of the third ring resonator 33 so that the ratio of values detected by the second photodetector 552 and the first photodetector 551, respectively, (the ratio corresponding to the transmittance of the etalon 550) takes a desired value. This makes it possible to control the wavelength $\lambda_{13}$, at which a resonant wavelength of the first ring resonator 31 and a resonant wavelength of the third ring resonator 33 coincide with each other, to takes a desired wavelength, and to control the oscillation wavelength of the first laser light to have the desired wavelength. Note that the first laser light having passed through the first beam splitter 541 is emitted to an optical fiber or the like via the lens 532.

The second laser light oscillated in the second laser resonator and emitted from the one end surface 20a of the second SOA 20 goes through the lens 533, and is split into transmitting laser light and reflected laser light, for example, by the ratio of 10:1. The laser light having been reflected in the third beam splitter 543 is incident on the third photodetector 553 by which the amount of light is detected. Note that the second laser light having passed through the third beam splitter 543 is emitted to an optical fiber or the like via the lens 534.

The laser apparatus in the present embodiment controls the current in the second SOA 20 based on a value detected by the third photodetector 553, and hence, can emit the second laser light having a desired intensity. Also, similar to the first laser light, the oscillation wavelength of the second laser light coincides with one of the resonant wavelengths of the third ring resonator 33. Therefore, in case of the FSR of the third ring resonator 33 being 25 GHz, if the oscillation wavelength of the first laser light is adjusted to an ITU-T grid with the interval of 25 GHz, the oscillation wavelength of the second laser light is automatically adjusted to coincide with the ITU-T grid with the interval of 25 GHz.

By controlling the current flowing in the heater electrode 32a in the second ring resonator 32, the oscillation wavelength of the second laser light can be changed as a wavelength at which a resonant wavelength of the second ring resonator 32 and a resonant wavelength of the third ring resonator 33 coincide with each other. For example, the oscillation wavelength of the second laser light can be set to a wavelength away from the oscillation wavelength of the first laser light by an arbitrary integer multiple of 25 GHz such as 25 GHz, 50 GHz, 75 GHz, and 100 GHz.

Seventh Embodiment

Figure 18:
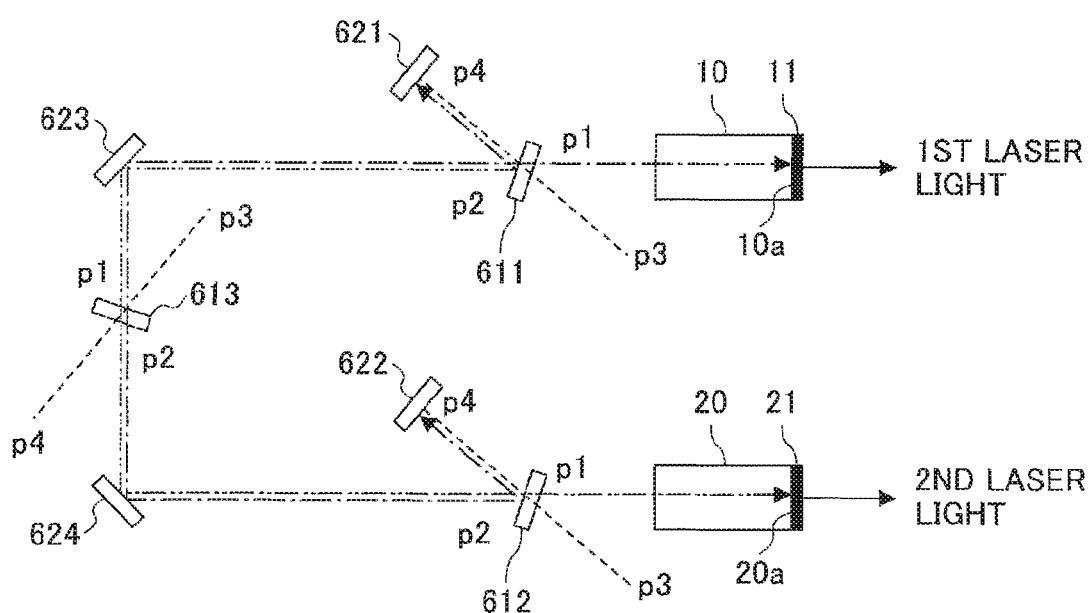
FIG. 18 is a structural diagram of a laser apparatus according to a seventh embodiment.

Next, a seventh embodiment will be described based on FIG. 18. A laser apparatus in the present embodiment includes a first SOA 10, a second SOA 20, a first etalon 611, a second etalon 612, a third etalon 613, a first mirror 621, a second mirror 622, a third mirror 623, and a fourth mirror 624.

The first etalon 611, the second etalon 612, and the third etalon 613 are Fabry-Perot etalons that have cyclic wavelength selection characteristic, respectively, similar to a ring resonator. Specifically, each of the first etalon 611, the second etalon 612, and the third etalon 613 has a characteristic to selectively pass light having a predetermined resonant wavelength determined by the thickness of the etalon, and to reflect light having other wavelengths.

Figure 19A:
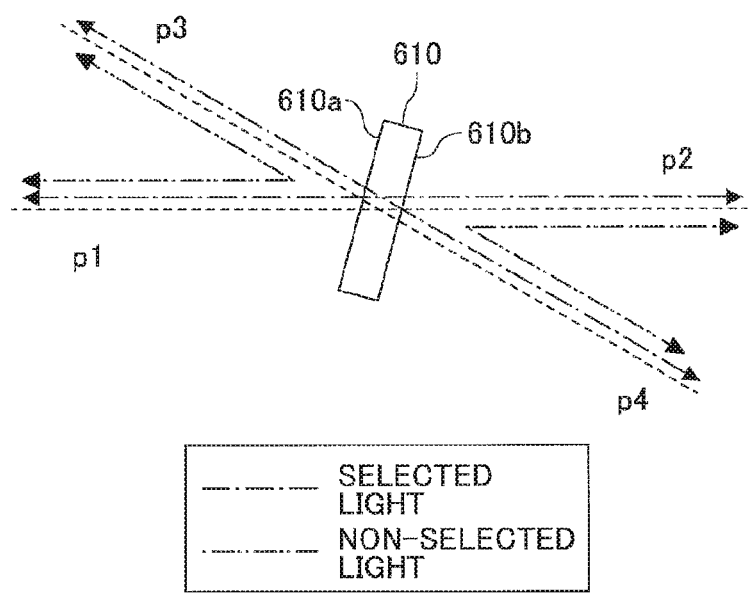
FIGS. 19A-19C are diagrams illustrating an etalon in the seventh embodiment.

A case will be considered in which an etalon 610 is installed tilted with respect to incident light as illustrated in FIG. 19A. Assume that a port p1 is a direction in which light is incident on a surface 610a of the etalon 610, and a port p2 is a direction in which light is incident on another surface 610b of the etalon 610. Also assume that a port p3 is a direction in which light having been incident on the surface 610a of the etalon 610 is reflected, and a port p4 is a direction in which light having been incident on the other surface 610b of the etalon 610 is reflected. In a wavelength selection filter by this etalon 610, light having a resonant wavelength as the light to be selected passes through the etalon 610 to propagate between p1 and p2 or between p3 and p4, and light other than the resonant wavelengths as the light not to be selected is reflected to propagate between p1 and p3 or between p2 and p4. Therefore, the etalon 610 is a wavelength selection filter that has substantially the same characteristic as a wavelength selection filter formed with a ring resonator.

Figure 19B:
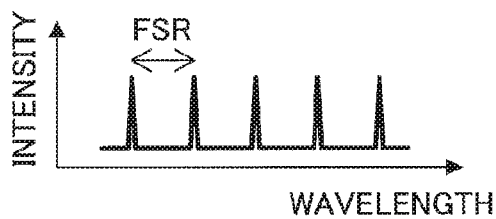
Figure 19C:
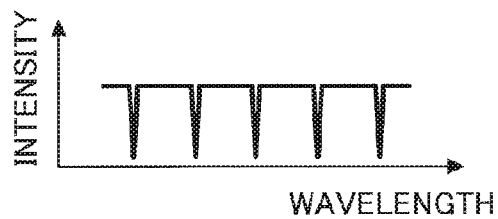

FIG. 19B illustrates a spectrum of the transmitting light being the light to be selected in the etalon 610 illustrated in FIG. 19A, and FIG. 19C illustrates a spectrum of the reflected light being the light not to be selected in FIG. 19A. As illustrated in FIG. 19B, this etalon 610 can select only the light having the resonant wavelengths that appear cyclically.

The first etalon 611, the second etalon 612, and the third etalon 613 used in the present embodiment have substantially the same structure as the etalon 610 illustrated in FIG. 19A.

Therefore, in the present embodiment, the first laser light is emitted by the first laser resonator formed with the partially-reflecting mirror 11 formed on the one end surface 10a of the first SOA 10 and the second mirror 622. Therefore, in the first laser resonator, the first SOA 10 corresponds to a first gain medium, and laser oscillation is implemented on an optical path that passes through the first etalon 611, is reflected on the third mirror 623, passes through the third etalon 613, is reflected on the fourth mirror 624, and is reflected on the second etalon 612.

Also, the second laser light is emitted by the second laser resonator formed with the partially-reflecting mirror 21 formed on the one end surface 20a of the second SOA 20 and the first mirror 621. Therefore, in the second laser resonator, the second SOA 20 corresponds to a second gain medium, and laser oscillation is implemented on an optical path that passes through the second etalon 612, is reflected on the fourth mirror 624, passes through the third etalon 613, is reflected on the third mirror 623, and is reflected on the first etalon 611.

Therefore, the first laser light and the second laser light can be emitted independently.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the present embodiments of the present invention have been described in detail, it should be understood that the various changes, substitutions, and alterations could be made hereto without departing from the spirit and scope of the invention.

What is claimed is:

1. A laser apparatus comprising:
a first gain medium;
a partially-reflecting mirror placed on a side of one end surface of the first gain medium;
a second gain medium;
a partially-reflecting mirror placed on a side of one end surface of the second gain medium;
a first wavelength selection filter;
a second wavelength selection filter;
a third wavelength selection filter;
a first mirror; and
a second mirror,
wherein a wavelength of first laser light emitted from the one end surface of the first gain medium is different from a wavelength of second laser light emitted from the one end surface of the second gain medium,
wherein each of the first wavelength selection filter, the second wavelength selection filter, and the third wavelength selection filter includes a first input/output port, a second input/output port, a third input/output port, and a fourth input/output port,
wherein for light to be selected having a selected wavelength, the first input/output port is connected with the second input/output port, and the third input/output port is connected with the fourth input/output port; for light not to be selected, the first input/output port is connected with the third input/output port, and the second input/output port is connected with the fourth input/output port,
wherein the third wavelength selection filter is a wavelength selection filter to select light having wavelengths that cyclically exist in the light, as the light to be selected,
wherein another end surface of the first gain medium is connected with the first input/output port of the first wavelength selection filter,
wherein another end surface of the second gain medium is connected with the first input/output port of the second wavelength selection filter,
wherein the fourth input/output port of the first wavelength selection filter is connected with the first mirror,
wherein the fourth input/output port of the second wavelength selection filter is connected with the second mirror,
wherein the first input/output port of the third wavelength selection filter is connected with the second input/output port of the first wavelength selection filter,
wherein the second input/output port of the third wavelength selection filter is connected with the second input/output port of the second wavelength selection filter.

2. The laser apparatus as claimed in claim 1, wherein the first wavelength selection filter includes a first ring resonator, to select light having a resonant wavelength in the first ring resonator, wherein the second wavelength selection filter includes a second ring resonator, to select light having a resonant wavelength in the second ring resonator, wherein the third wavelength selection filter includes a third ring resonator, to select light having a resonant wavelength in the third ring resonator.

3. The laser apparatus as claimed in claim 2, wherein a cycle of the resonance wavelengths in the first ring resonator and a cycle of the resonance wavelengths in the second ring resonator are different from a cycle of the resonance wavelengths in the third ring resonator.

4. The laser apparatus as claimed in claim 2, wherein the first wavelength selection filter includes a fourth ring resonator in addition to the first ring resonator, a cycle of the resonance wavelengths in the first ring resonator is different from a cycle of the resonance wavelengths in the fourth ring resonator, and the first wavelength selection filter selects a wavelength which is one of the resonance wavelengths of the first ring resonator that coincides with one of resonance wavelengths of the fourth ring resonator, wherein the second wavelength selection filter includes a fifth ring resonator in addition to the second ring resonator, a cycle of the resonance wavelengths in the second ring resonator is different from a cycle of the resonance wavelengths in the fifth ring resonator, and the second wavelength selection filter selects a wavelength which is one of the resonance wavelengths of the second ring resonator that coincides with one of resonance wavelengths of the fifth ring resonator.

5. The laser apparatus as claimed in claim 2, wherein a full width at half maximum of the resonance wavelength in the first ring resonator is less than or equal to ½ of a difference between a cycle of the resonance wavelengths in the first ring resonator and a cycle of the resonance wavelengths in the third ring resonator, wherein a full width at half maximum of the resonance wavelength in the second ring resonator is less than or equal to ½ of a difference between a cycle of the resonance wavelengths in the second ring resonator and a cycle of the resonance wavelengths in the third ring resonator.

6. The laser apparatus as claimed in claim 2, wherein cycles of the resonance wavelengths in the first wavelength selection filter and the second wavelength selection filter are minutely shifted from an integer multiple of a cycle of the resonance wavelengths in the third wavelength selection filter.

7. The laser apparatus as claimed in claim 2,
wherein the first mirror and the second mirror are mirrors to reflect the light having the selected wavelengths, respectively.

8. The laser apparatus as claimed in claim 2,
wherein the first ring resonator, the second ring resonator, and the third ring resonator are formed by silicon waveguides, respectively.

9. The laser apparatus as claimed in claim 1,
wherein the first mirror and the second mirror are wavelength selection mirrors to select wavelengths different from each other.

10. The laser apparatus as claimed in claim 1,
wherein the first wavelength selection filter includes a first etalon, to select light having passed through the first etalon,
wherein the second wavelength selection filter includes a second etalon, to select light having passed through the second etalon,
wherein the third wavelength selection filter includes a third etalon, to select light having passed through the third etalon.

11. The laser apparatus as claimed in claim 1,
wherein the first gain medium is a first semiconductor optical amplifier,
wherein the second gain medium is a second semiconductor optical amplifier.

12. The laser apparatus as claimed in claim 1, further comprising:
a first photodetector to detect an amount of light of a part of the first laser light;
a second photodetector to detect an amount of light of a part of the first laser light after having passed through a locker etalon;
a third photodetector to detect an amount of light of the second laser light; and
a control unit to control an oscillation wavelength of the first laser light and an oscillation wavelength of the second laser light, based on the amounts of the light detected by the first photodetector, the second photodetector, and the third photodetector, respectively.

13. A laser apparatus comprising:
a first gain medium;
a partially-reflecting mirror placed on a side of one end surface of the first gain medium;
a second gain medium;
a partially-reflecting mirror placed on a side of one end surface of the second gain medium;
a first wavelength selection filter;
a second wavelength selection filter;
a third wavelength selection filter;
a first mirror; and
a second mirror,
wherein a laser resonator is formed having the first gain medium, the first wavelength selection filter, and the third wavelength selection filter disposed on an optical path between the partially-reflecting mirror placed on the side of the one end surface of the first gain medium, and the second mirror,
wherein the laser apparatus emits, as first laser light, light having a wavelength selected in the first wavelength selection filter and the third wavelength selection filter, among light emitted from the other end surface of the first gain medium, from the one end surface of the first gain medium,
wherein another laser resonator is formed having the second gain medium, the second wavelength selection filter, and the third wavelength selection filter disposed on an optical path between the partially-reflecting mirror placed on the side of the one end surface of the second gain medium, and the first mirror,
wherein the laser apparatus emits, as second laser light, light having a wavelength selected in the second wavelength selection filter and the third wavelength selection filter, among light emitted from the other end surface of the second gain medium, from the one end surface of the second gain medium,
wherein the wavelength of the first laser light is different from the wavelength of the second laser light.

14. A laser apparatus comprising: a first gain medium;
a partially-reflecting mirror placed on a side of one end surface of the first gain medium;
a second gain medium;
a partially-reflecting mirror placed on a side of one end surface of the second gain medium;
a first wavelength selection filter including a first ring resonator;
a second wavelength selection filter including a second ring resonator;
a third wavelength selection filter including a third ring resonator;
a first optical waveguide on which light from another end surface of the first gain medium is incident;
a second optical waveguide on which light from another end surface of the second gain medium is incident;
a third optical waveguide having a first mirror formed at one terminal part; and
a fourth optical waveguide having a second mirror formed at one terminal part,
wherein a wavelength of first laser light emitted from the one end surface of the first gain medium is different from a wavelength of second laser light emitted from the one end surface of the second gain medium,
wherein each of the first wavelength selection filter, the second wavelength selection filter, and the third wavelength selection filter includes a first input/output port, a second input/output port, a third input/output port, and a fourth input/output port,
wherein for light to be selected having a selected wavelength, the first input/output port is connected with the second input/output port, and the third input/output port is connected with the fourth input/output port; for light not to be selected, the first input/output port is connected with the third input/output port, and the second input/output port is connected with the fourth input/output port,
wherein the third wavelength selection filter is a wavelength selection filter to select light having wavelengths that cyclically exist in the light, as the light to be selected,
wherein the other end surface of the first gain medium is connected with the first input/output port of the first wavelength selection filter via the first optical waveguide,
wherein the other end surface of the second gain medium is connected with the first input/output port of the second wavelength selection filter via the second optical waveguide,
wherein the fourth input/output port of the first wavelength selection filter is connected with the first mirror via the third optical waveguide,
wherein the fourth input/output port of the second wavelength selection filter is connected with the second mirror via the fourth optical waveguide, wherein the first input/output port of the third wavelength selection filter is connected with the second input/output port of the first wavelength selection filter, wherein the second input/output port of the third wavelength selection filter is connected with the second input/output port of the second wavelength selection filter.

15. A laser apparatus comprising:

a first gain medium;

a partially-reflecting mirror placed on a side of one end surface of the first gain medium;

a second gain medium;

a partially-reflecting mirror placed on a side of one end surface of the second gain medium;

a first wavelength selection filter including a first ring resonator;

a second wavelength selection filter including a second ring resonator;

a third wavelength selection filter including a third ring resonator;

a first optical waveguide on which light from another end surface of the first gain medium is incident;

a second optical waveguide on which light from another end surface of the second gain medium is incident;

a third optical waveguide having a first mirror formed at one terminal part; and a fourth optical waveguide having a second mirror formed at one terminal part, wherein the first ring resonator is formed between the first optical waveguide and the third optical waveguide, to drop light having a resonant wavelength in the first ring resonator, from the first optical waveguide down to the third optical waveguide, or from the third optical waveguide down to the first optical waveguide, wherein the second ring resonator is formed between the second optical waveguide and the fourth optical waveguide, to drop light having a resonant wavelength in the second ring resonator, from the second optical waveguide down to the fourth optical waveguide, or from the fourth optical waveguide down to the second optical waveguide, wherein the third ring resonator is formed between the third optical waveguide and the fourth optical waveguide, to drop light having a resonant wavelength in the third ring resonator, from the third optical waveguide down to the fourth optical waveguide, or from the fourth optical waveguide down to the third optical waveguide, wherein a laser resonator is formed having the first gain medium, the first wavelength selection filter, and the third wavelength selection filter disposed on an optical path between the partially-reflecting mirror placed on the side of the one end surface of the first gain medium, and the second mirror, wherein the laser apparatus emits, as first laser light, light having a wavelength selected in the first wavelength selection filter and the third wavelength selection filter, among light emitted from the other end surface of the first gain medium, from the one end surface of the first gain medium, wherein another laser resonator is formed having the second gain medium, the second wavelength selection filter, and the third wavelength selection filter disposed on an optical path between the partially-reflecting mirror placed on the side of the one end surface of the second gain medium, and the first mirror, wherein the laser apparatus emits, as second laser light, light having a wavelength selected in the second wavelength selection filter and the third wavelength selection filter, among light emitted from the other end surface of the second gain medium, from the one end surface of the second gain medium, wherein the wavelength of the first laser light is different from the wavelength of the second laser light.

* * * * *